(12) United States Patent
Swager et al.

(10) Patent No.: US 8,318,894 B2
(45) Date of Patent: Nov. 27, 2012

(54) CHARGED POLYMERS AND THEIR USES IN ELECTRONIC DEVICES

(75) Inventors: Timothy M. Swager, Newton, MA (US); Daisuke Izuhara, Kyoto (JP)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/033,441

(22) Filed: Feb. 23, 2011

(65) Prior Publication Data

US 2012/0130025 A1 May 24, 2012

Related U.S. Application Data

(60) Provisional application No. 61/415,271, filed on Nov. 18, 2010.

(51) Int. Cl.
*C08G 73/00* (2006.01)
(52) U.S. Cl. ............... 528/422; 528/423; 528/314
(58) Field of Classification Search .......... 528/422, 528/423, 314
See application file for complete search history.

(56) References Cited

U.S. PATENT DOCUMENTS 5,179,467 A * 1/1993 Buchwalter et al. .......... 359/270

OTHER PUBLICATIONS

Invitation to Pay Additional Fees for PCT/US2011/025863 mailed Aug. 4, 2011.
Izuhara et al., Bispyridinium-phenylene-based copolymers: low band gap n-type alternating copolymers. J Mater Chem. 2011; 21:3579-3584.
Izuhara et al., Electroactive Block Copolymer Brushes on Multiwalled Carbon Nanotubes. Macromolecules. 2009;42(15):5416-18.
Izuhara et al., Poly(3-hexylthiophene)-block-poly(pyridinium phenylene)s: Block Polymers of p- and n-Type Semiconductors. Macromolecules. 2011;44(8):2678-2684.
Izuhara et al., Poly(pyridinium phenylene)s: water-soluble N-type polymers. J Am Chem Soc. Dec. 16, 2009;131(49):17724-5.
Manoj et al., Photogenerated charge carrier transport in p-polymer n-polymer bilayer structures. J Appl Phys. 2003;94(6):4088-95.
International Search Report and Written Opinion for PCT/US2011/025863 mailed Feb. 7, 2012.

* cited by examiner

*Primary Examiner* — Shane Fang
(74) *Attorney, Agent, or Firm* — Wolf, Greenfield & Sacks, P.C.

(57) ABSTRACT

The present invention generally relates to compositions and methods comprising charged polymers. The compositions can be used in a variety of applications, for example, in photovoltaic cells, field-effect transistors, and light emitting diodes. In some embodiments, the backbone of a charged polymer comprises at least one quaternary nitrogen and/or is conjugated.

8 Claims, 15 Drawing Sheets

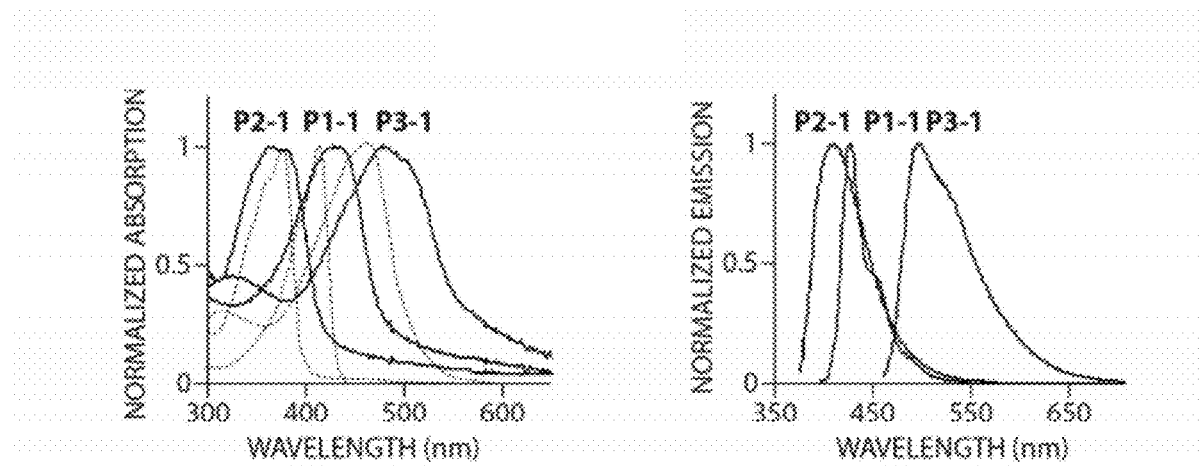
Fig. 2A
Fig. 2B
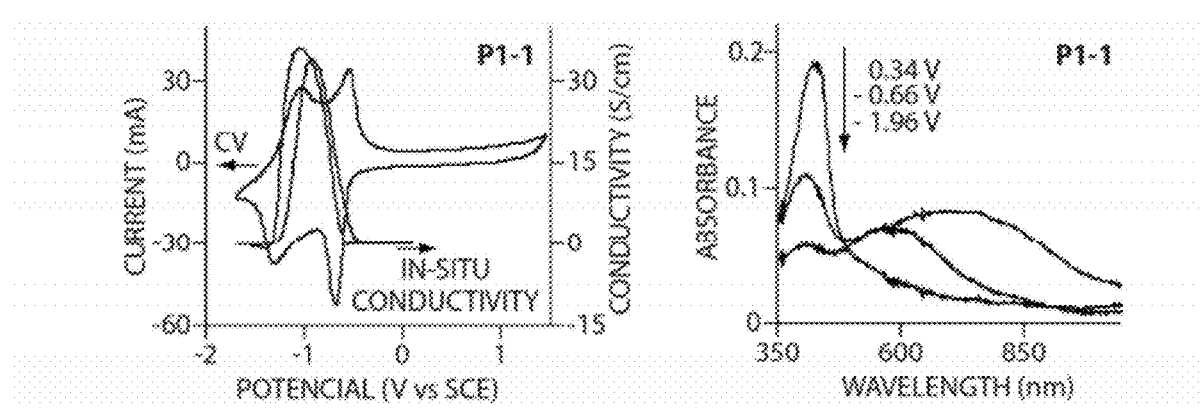
Fig. 2C
Fig. 2D
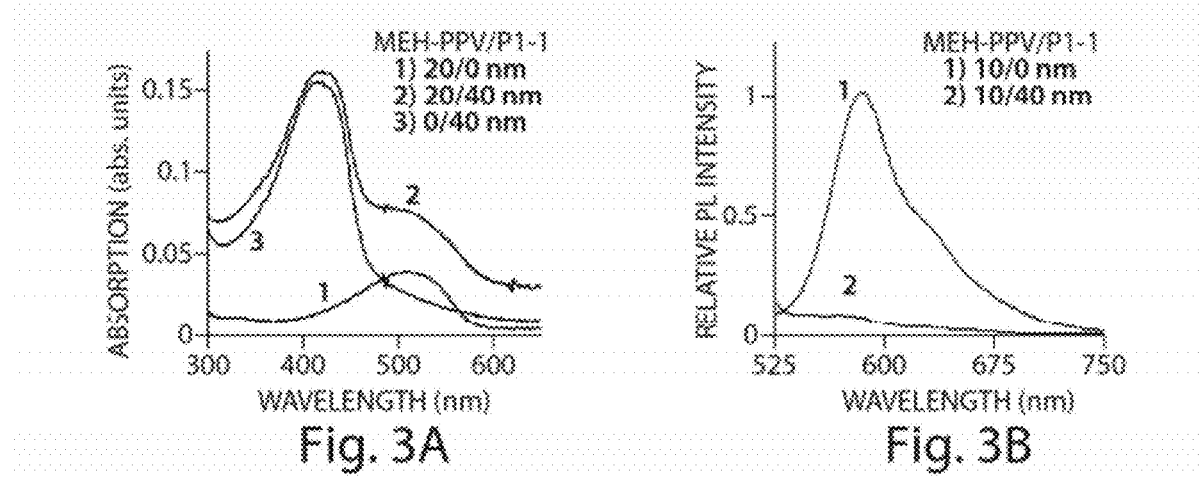
Fig. 3A
Fig. 3B

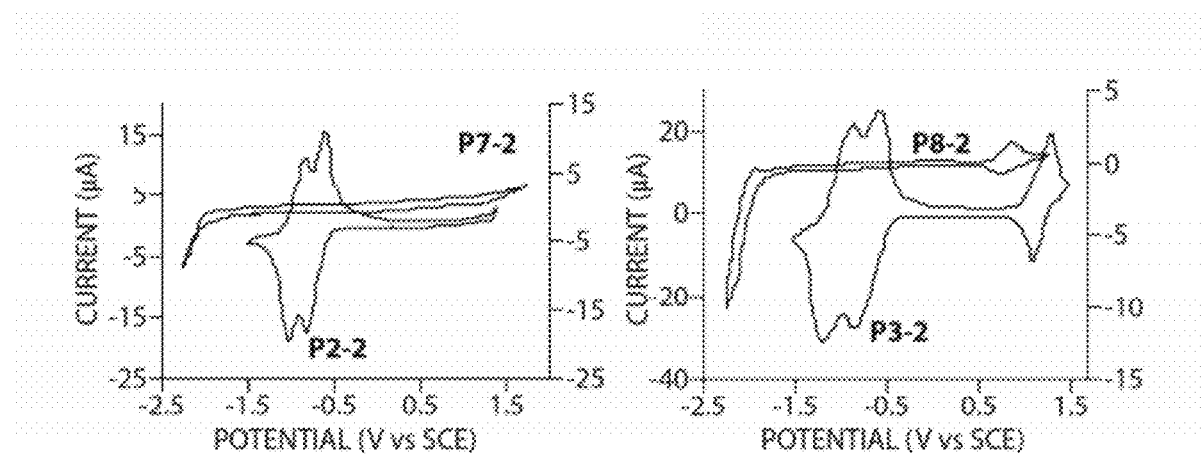
Fig. 11A
Fig. 11B
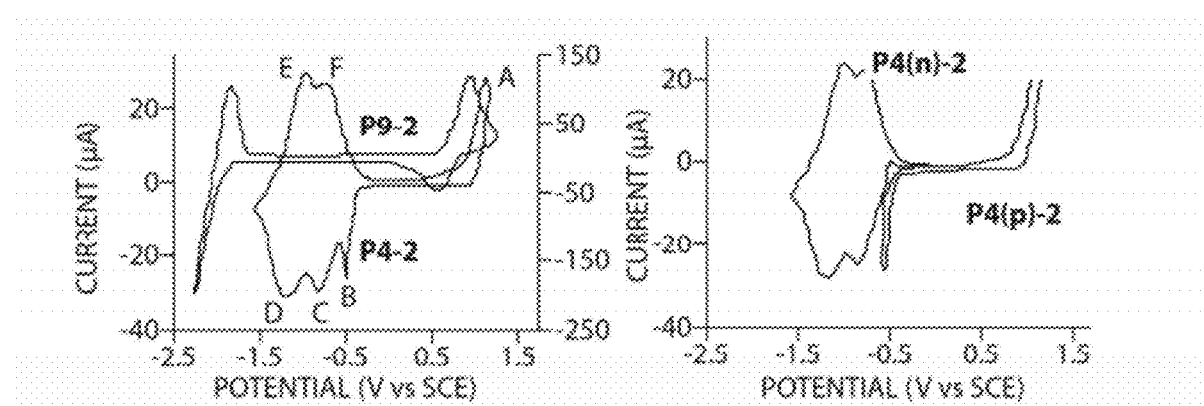
Fig. 11C
Fig. 11D
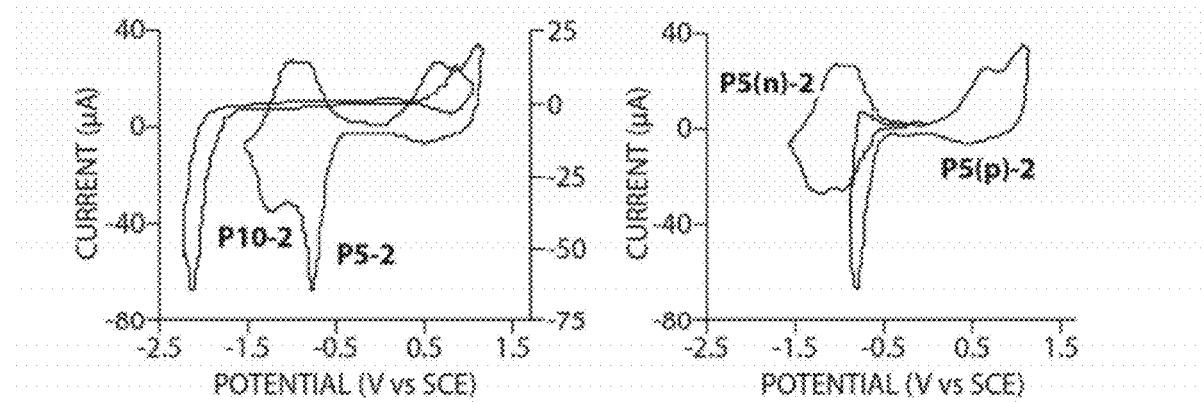
Fig. 11E
Fig. 11F

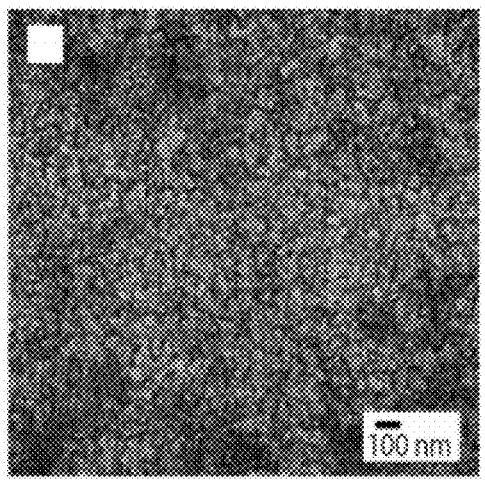 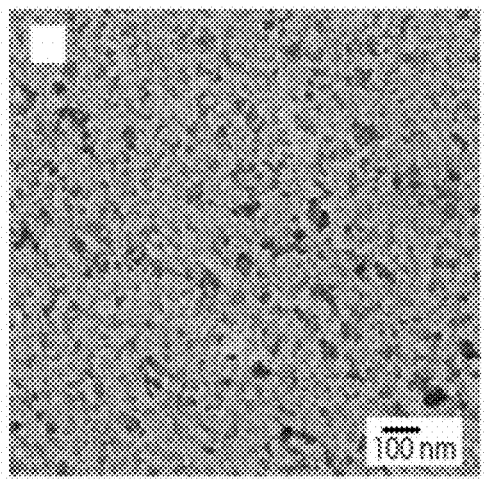
Fig. 14A        Fig. 14B
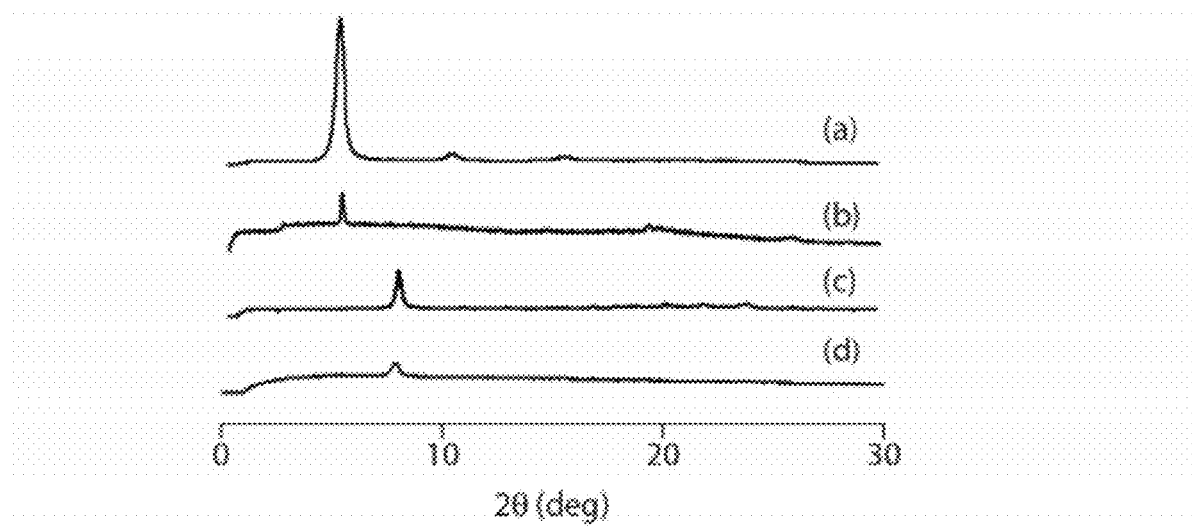
Fig. 15

CHARGED POLYMERS AND THEIR USES IN ELECTRONIC DEVICES

RELATED APPLICATIONS

The present application claims priority to U.S. provisional application, U.S. Ser. No. 61/415,271, filed Nov. 18, 2010, entitled "Charged Polymers And Their Uses In Electronic Devices," by Swager et al., herein incorporated by reference.

STATEMENT REGARDING FEDERALLY SPONSORED RESEARCH OR DEVELOPMENT

This invention was made with Government support under Grant No. DMR-0706408, awarded by the National Science Foundation. The Government has certain rights in this invention.

FIELD OF THE INVENTION

The present invention generally relates to compositions and methods comprising charged polymers. The compositions can be used in a variety of applications, for example, in photovoltaic cells, field-effect transistors, and light emitting diodes. In some embodiments, the backbone of a charged polymer comprises at least one quaternary nitrogen and/or is conjugated.

BACKGROUND OF THE INVENTION

Conjugated polymer semiconductors may find application in optoelectronic and electrochemical devices, such as photovoltaic cells, light emitting diodes, sensors, electrochromics, and field-effect transistors. Polymeric materials can offer numerous advantages including access to a flexible and/or light-weight device and/or the ability to fabricated the device in large area formats using low-cost processing techniques (e.g., solution processing). For electrochemical devices, the electron-donating or electron-accepting properties of the conjugated polymers are important. Although many varieties of high performance p-type (electron donor) polymers are available, suitable n-type (electron acceptor) polymers remain largely elusive.

Relatively few studies have been reported concerning heterojunctions between p/n-type polymers for photovoltaic cells, mainly due to the limited n-type polymers with appropriate levels of electron affinity (EA). As a result, organic polymer photovoltaic devices generally employ fullerene acceptor molecules as the n-type material. Use of fullerene derivatives is disadvantageous because of the relatively weak absorption in the visible and near-infrared regions.

Accordingly, improved methods and compositions are needed, including novel n-type polymeric materials

SUMMARY OF THE INVENTION

According to some aspects of the present invention, methods are provided. In some cases, a method comprises providing a polymer comprising at least one repeating unit, wherein at least a portion of the repeating unit has the structure:

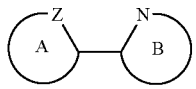

wherein A is a ring or a portion of a ring system, optionally comprising at least one heteroatom, and optionally substituted; B is a ring or a portion of a ring system, wherein the ring system comprises N and, optionally, at least one additional heteroatom, and optionally substituted; Z is C or a heteroatom; and subjecting the polymer to suitable conditions to transform the polymer, wherein after transformation the at least one repeating unit has the structure:

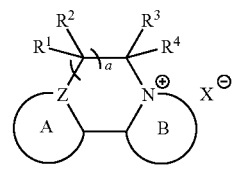

wherein $X^{\ominus}$ is an anionic species; a is 0, 1, 2, or 3; and $R^1$, $R^2$, $R^3$ and $R^4$ can be the same or different and are hydrogen, alkyl, alkenyl, alkynyl, heteroalkyl, aryl, or heteroaryl, or optionally any number of $R^1$, $R^2$, $R^3$ and/or $R^4$ can be joined together or with an atom from A or B to form one or more rings, or optionally any one of $R^1$, $R^2$, $R^3$ and $R^4$ is absent according to standard valance requirements.

According to some aspects of the present invention, polymeric compositions are provided. In some embodiments, a polymeric composition comprises a polymer backbone, wherein the polymer backbone comprises at least one repeating unit comprising a three-ring system containing at least one quaternary nitrogen. In some cases, the at least one repeating unit comprising a three-ring system containing at least one quaternary nitrogen has the structure:

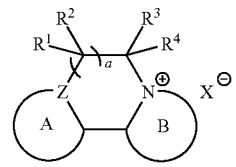

wherein $X^{\ominus}$ is an anionic species; a is 0, 1, 2, or 3; Z is C or a heteroatom; and $R^1$, $R^2$, $R^3$ and $R^4$ can be the same or different and are hydrogen, alkyl, alkenyl, alkynyl, heteroalkyl, aryl, or heteroaryl, or optionally any number of $R^1$, $R^2$, $R^3$, and/or $R^4$ can be joined together or with an atom from A or B to form one or more rings, or optionally any one of $R^1$, $R^2$, $R^3$, and $R^4$ is absent according to standard valance requirements. In some cases, the at least one repeating unit comprising a three-ring system containing at least one quaternary nitrogen has the structure:

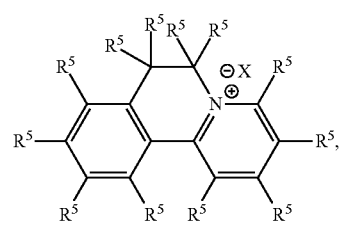

-continued

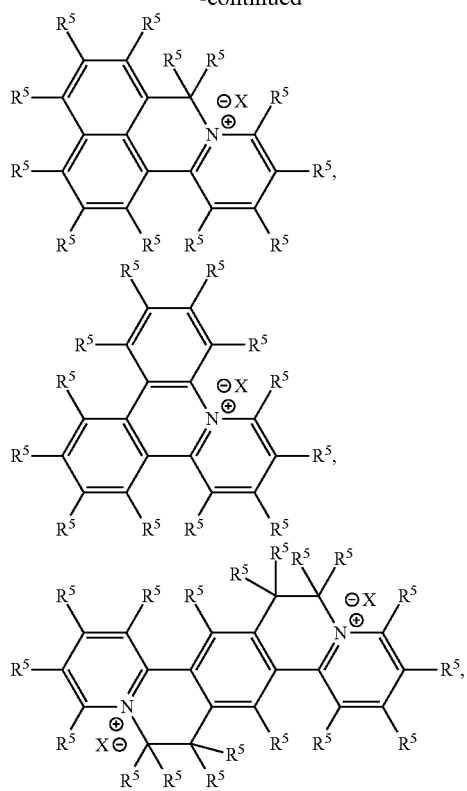

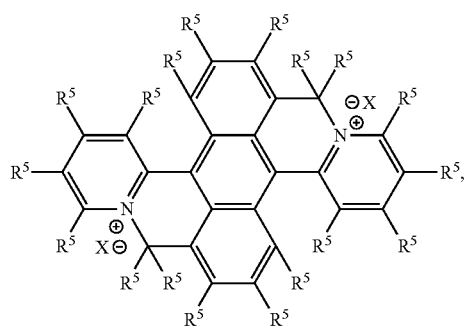

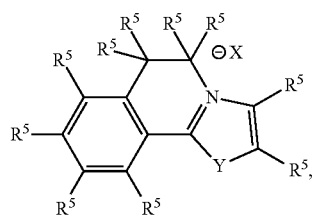

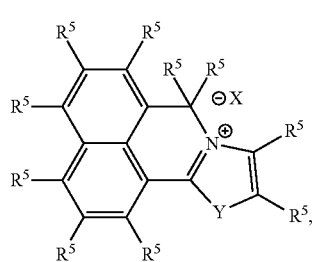

-continued

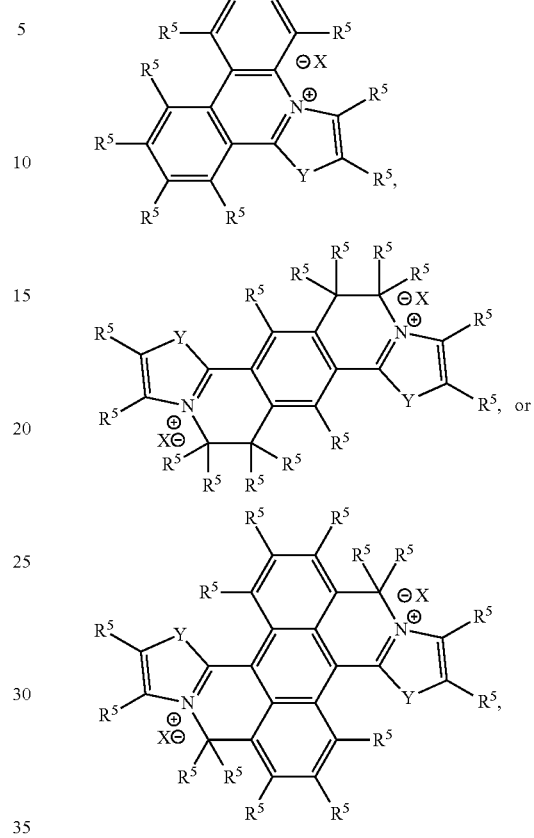

wherein $X^{\ominus}$ is an anionic species; Y is a heteroatom; and wherein each $R^5$ can be the same or different and is a suitable substituent, may join together with another $R^5$ to form a ring, and/or may form a bond with another repeating unit and/or an end-group of the polymer, in accordance with standard valence requirements. In some cases, the at least one repeating unit comprising a three-ring system containing at least one quaternary nitrogen has the structure:

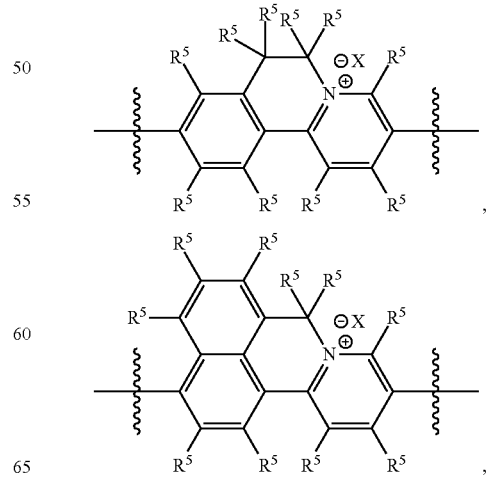

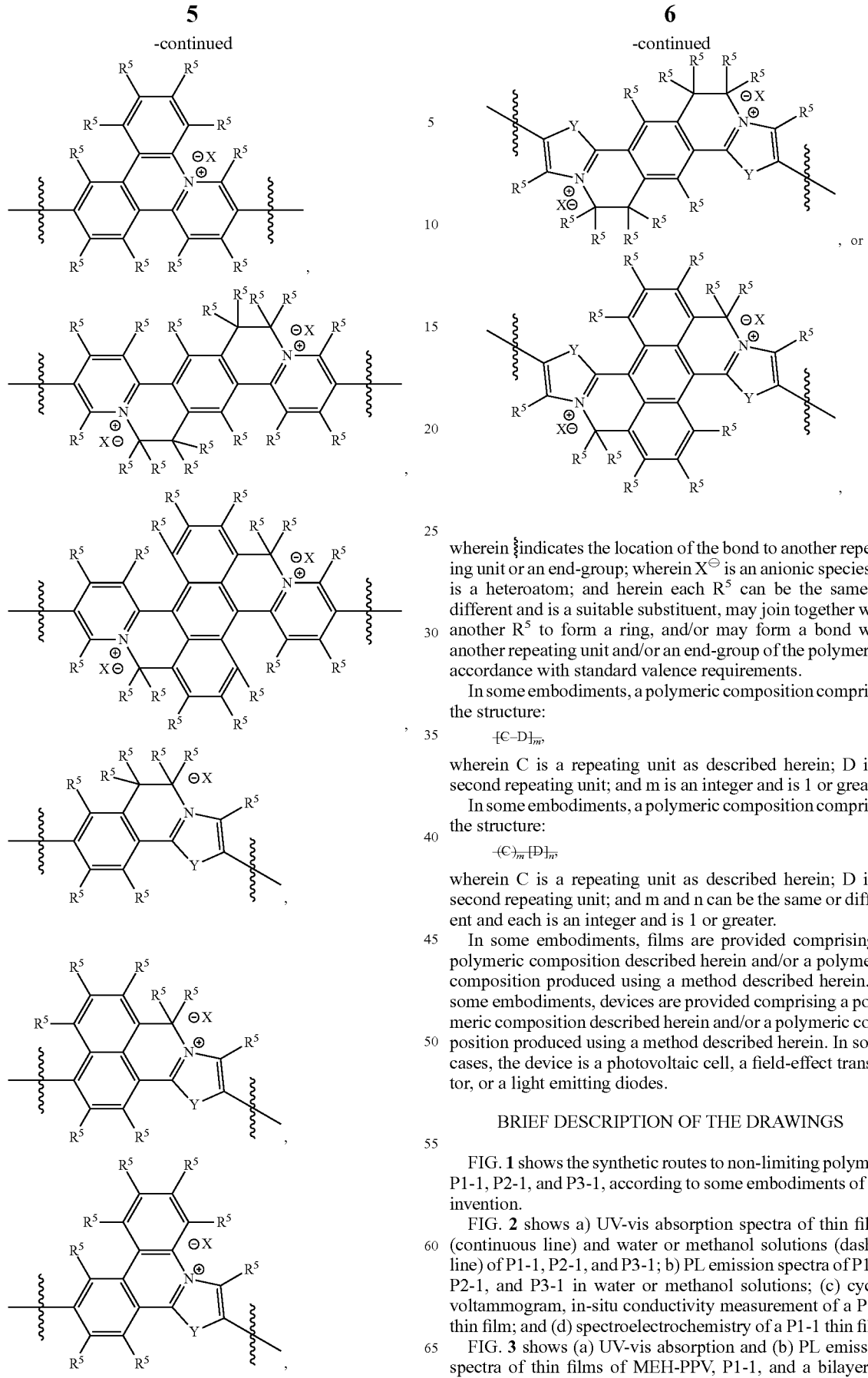

wherein ⌇ indicates the location of the bond to another repeating unit or an end-group; wherein $X^{\ominus}$ is an anionic species; Y is a heteroatom; and herein each $R^5$ can be the same or different and is a suitable substituent, may join together with another $R^5$ to form a ring, and/or may form a bond with another repeating unit and/or an end-group of the polymer, in accordance with standard valence requirements.

In some embodiments, a polymeric composition comprises the structure:

─[C─D]$_m$, wherein C is a repeating unit as described herein; D is a second repeating unit; and m is an integer and is 1 or greater.

In some embodiments, a polymeric composition comprises the structure:

─(C)$_m$─[D]$_n$, wherein C is a repeating unit as described herein; D is a second repeating unit; and m and n can be the same or different and each is an integer and is 1 or greater.

In some embodiments, films are provided comprising a polymeric composition described herein and/or a polymeric composition produced using a method described herein. In some embodiments, devices are provided comprising a polymeric composition described herein and/or a polymeric composition produced using a method described herein. In some cases, the device is a photovoltaic cell, a field-effect transistor, or a light emitting diodes.

BRIEF DESCRIPTION OF THE DRAWINGS

FIG. 3 shows (a) UV-vis absorption and (b) PL emission spectra of thin films of MEH-PPV, P1-1, and a bilayer of MEH-PPV/P1-1.

FIG. 11 shows cyclic voltammograms of drop-cast films of P2-1 to P5-2 and P6-2 to P10-2.

FIG. 14 shows TEM images of the self-assembled structures of (a) P3HT90-b-PPymPh10 and (b) P3HT80-b-PPymPh20.

FIG. 15 shows XRD spectra for (a) P3HT, (b) P3HT90-b-PPymPh10, (c) P3HT80-b-PPymPh20, and (d) PPymPh.

Figure 1:
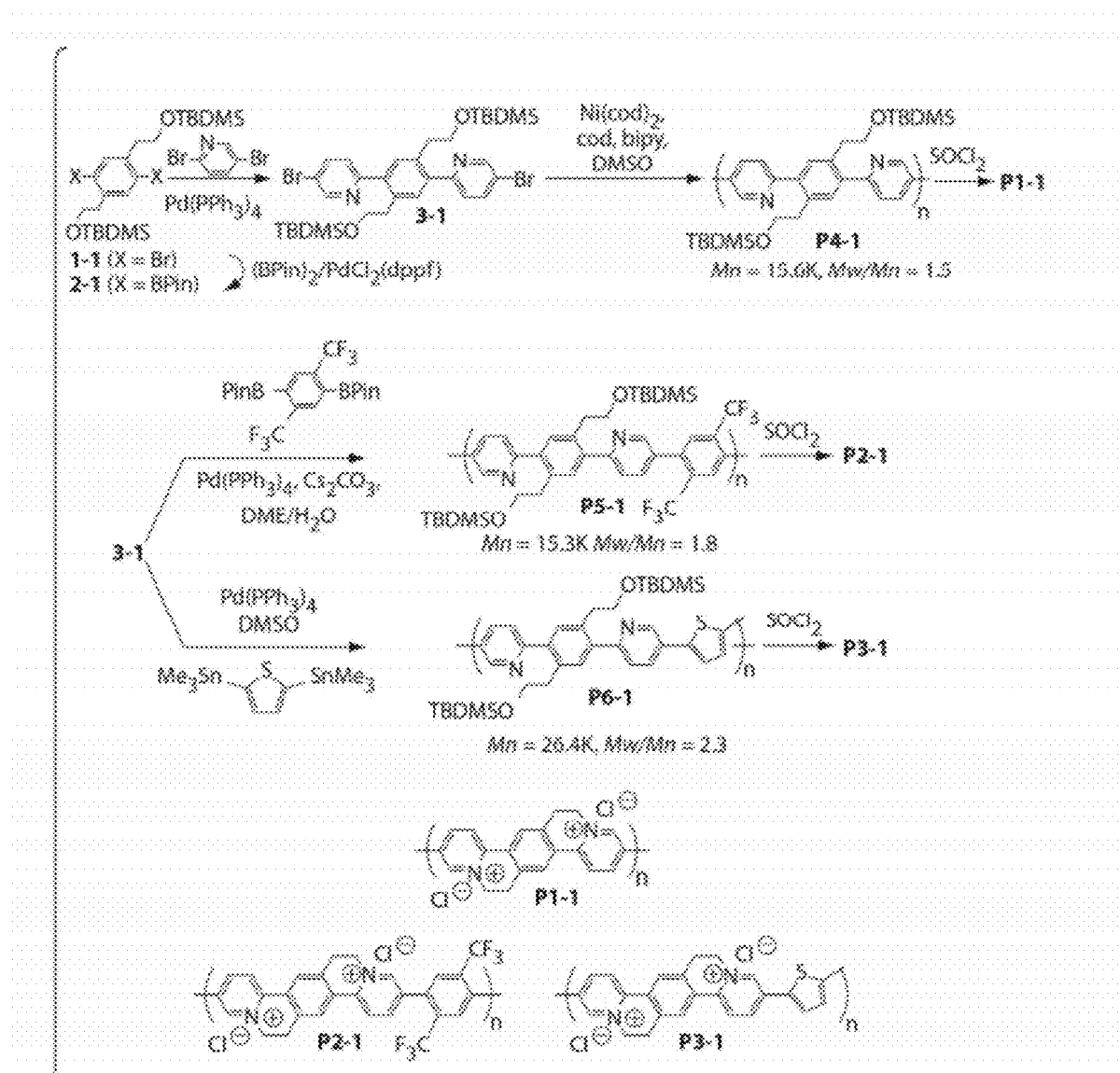
FIG. 1 shows the synthetic routes to non-limiting polymers P1-1, P2-1, and P3-1, according to some embodiments of the invention.

Other aspects, embodiments, and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention generally relates to compositions and related methods comprising charged polymers, which may find use in a variety of application, for example, in photovoltaic cells, field-effect transistors, or light emitting diodes. Generally, a charged polymer comprises at least one quaternary nitrogen and/or a conjugated backbone. The subject matter of the present invention involves, in some cases, interrelated products, alternative solutions to a particular problem, and/or a plurality of different uses of one or more systems and/or articles.

The methods of the present invention, in some embodiments, provide access to highly-charged polymeric materials. In some cases, the methods comprise forming a precursor polymer, wherein the precursor polymer is substantially neutral, followed by transformation of the polymer into a highly-charged polymer. The ability to transform the precursor polymer into a highly-charged polymer following formation of a polymer chain may allow for access to polymeric materials which may otherwise not be accessible. In some embodiments, the use of precursor polymers in the methods can allow for the synthesis of high molecular weight highly-charged polymers which may otherwise be incompatible with the highly accepting and ionic nature of the final polymers. As a specific example, highly electron-accepting materials are generally not compatible with highly reducing transition metal complexes that may be intermediates in the syntheses of polyaromatic polymers. In addition, the ionic nature of the final polymers generally favors solubility in highly polar solvents that are similarly often not suitable for use in polymerization reactions.

The polymer compositions, in some embodiments, may provide access to one or more properties of importance for use in applications such as photovoltaic cells, field-effect transistors, and light emitting diodes. In some cases, the polymers promote strong charge transfer electronic transitions that can give rise to red-shifts in the band gap, and thus, may provide a good match to the solar spectrum as well as increased absorbtivity of light. In some cases, the polymer transformation creates polymers having fused ring structures in the polymer backbone. This enforcement of a planar structure can results in extended electronic delocalization and/or high conductivities. In some cases, the high conductivities are indicative of facilitated electron transfer through the materials, which may be used, for example, to lower resistive losses in organic photovoltaic materials and/or give higher current densities in field effect transistor devices.

The ionic nature of the polymers may also be useful in material processing and/or device fabrication. In some cases, the solubility of the polymers in water, polar organic solvents, or combinations thereof allows for formation of devices comprising defined layers of polymers. For example, the polymers can be deposited (e.g., by solution methods) on top of other less polar materials that are soluble in common organic solvents (chloroform, THF, methylene chloride, toluene, etc.) and substantially insoluble in polar solvents. The resulting layered structure may be useful in numerous application, for example, diodes, and electron-transporting layers (e.g., for use in organic light emitting devices).

In some cases, the polymers may be used in conjunction with other self-assembly methods, for example, in the formation of organized bulk heterojunctions (e.g., in organic photovoltaic cells). For example, mixtures of organic solvents containing one polymer and a water phase containing another polymer can for a liquid crystalline material, thereby forming inter-penetrating bicontinuous networks of electron-donating polymers and electron-accepting polymers. The structure of the phases may be controlled to produce materials with feature sizes that can be optimized for the specific application, for example, for excitonic transport and charge dissociation.

In some cases, the present invention also provides block co-polymers, wherein at least one block comprises a polymeric material of the present invention. By appropriate selection of the polymers for each block, the blocks may assemble into phase-separated micro-domains. In addition, the synthesis of the block co-polymers can provide access to a material that has a bulk heterojunction spanned by the block copolymer. In such embodiments, the polymers in each domain are connected through covalent bonds and thus, defects (e.g., cracks, large energetic barriers) can be minimized and/or eliminated at the interfaces between the two materials. Such architecture can give rise to an optimal dissociation of excitons into electrons and/or holes. The properties (e.g., including organization) of the block co-polymers may be controlled using techniques known to those of ordinary skill in the art, for example, by altering the molecular weight of each block, by blending homopolymers into the mixtures, by solution processing, and/or by mechanical means (e.g., stretching, annealing, etc.).

According to some aspects of the present invention, polymeric compositions are provided. The polymeric compositions may find use in a variety of applications, for example, field-effect transistors, photovoltaic cells, and light emitting diodes, as described herein.

In some embodiments, a polymeric composition comprises a polymer backbone, wherein the polymer backbone comprises at least one repeating unit comprising a three-ring system containing at least one quaternary nitrogen. The term "ring system" is given its ordinary meaning in the art and refers to a system comprising at least two heterocyclyl, cycloalkyl, aryl, or heteroaryl rings, wherein each ring shares at least two atoms with at least one other ring of the system. In some cases, the ring system is substantially planar. The term "three-ring system" refers to a system comprising three heterocyclyl, cycloalkyl, aryl, or heteroaryl rings, wherein each of the three rings shares at least two atoms with the other rings. Non-limiting examples of three-ring systems including three six-membered rings include:

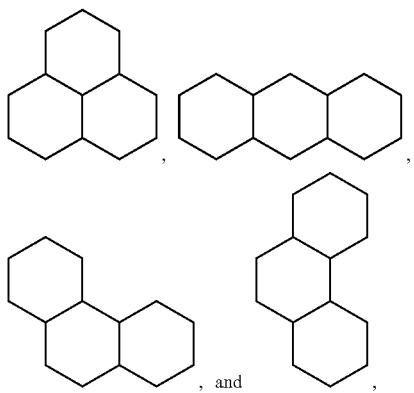

wherein the rings may be aromatic or non-aromatic, and may optionally comprise at least one heteroatom. In some cases, the polymer backbone comprises at least one repeating unit comprising a four-ring system, or a five-ring system, or a six-ring system containing at least one quaternary nitrogen. Those of ordinary skill in the art will be aware of four-ring systems, five-ring systems, six-ring systems, etc. In some cases, a ring system may contain more than one quaternary nitrogen (e.g., 2, 3, 4, 5, etc. quaternary nitrogens). In some cases, a ring system contains 2 quaternary nitrogens.

The term "quaternary nitrogen" is given its ordinary meaning in the art and refers to a tetrasubstituted or heteroaromatic nitrogen which is positively charged, for example:

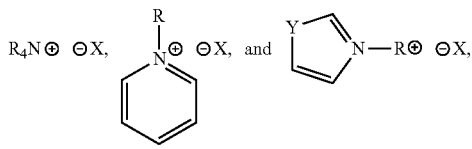

wherein X is an anionic species and R is a suitable substituent (e.g., hydrogen, alkyl, aryl, etc.)

In embodiments wherein the ring system "contains" a quaternary nitrogen, the quaternary nitrogen is an atom of the ring system (e.g., as opposed to a pendant quaternary nitrogen). Thus, as will be understood by those of ordinary skill in the art, a polymer containing at least one quaternary nitrogen in the backbone refers to a polymer wherein the quaternary nitrogen is in the polymer backbone chain, and does not include polymers wherein the quaternary nitrogen is contained in a pendant group of the polymer, is an endgroup of the polymer, and/or wherein a quaternary nitrogen group (e.g., $NH_4^+$) is associated as a cation with a negatively charged group in the polymer (e.g., in the polymer backbone).

The term "polymer," as used herein, refers to extended molecular structures comprising a backbone (e.g., non-conjugated backbone, conjugated backbone) which optionally contain pendant side groups. The term "backbone" is given its ordinary meaning in the art and refers to the main structure of a polymer onto which substituents may be attached. In some embodiments, the backbone can refers to the longest continuous bond pathway of the polymer. In some cases, at least a portion of the polymer is conjugated, i.e. the polymer has at least one conjugated portion. By this arrangement, electron density or electronic charge can be conducted along the portion where the electronic charge is referred to as being "delocalized." Each p-orbital participating in conjugation can have sufficient overlap with adjacent conjugated p-orbitals. In one embodiment, the conjugated portion is at least about 30 Å in length. In some embodiments, the entire backbone is conjugated and the polymer is referred to as a "conjugated polymer." Polymers having a conjugated pi-backbone capable of conducting electronic charge are typically referred to as "conducting polymers." In some cases, the conjugated pi-backbone may be defined by a plane of atoms directly participating in the conjugation, wherein the plane arises from a preferred arrangement of the p-orbitals to maximize p-orbital overlap, thus maximizing conjugation and electronic conduction. In some cases, the pi-backbone may preferably have a non-planar or twisted ground state conformation, leading to decreased conjugation and a higher energy conduction band.

The term "repeating unit" is given its ordinary meaning in the art and refers to a a structure which is present at least twice, and typically more times (e.g., 3, 4, 10, or more times) within the polymer backbone. Generally, a repeating unit is a portion of a polymer chain derived from a single molecule of monomer.

In some embodiments, the at least one repeating unit comprising a three-ring system containing at least one quaternary nitrogen has the structure:

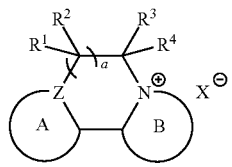

wherein $X^\ominus$ is an anionic species, a is 0, 1, 2, or 3, Z is C or a heteroatom, and $R^1$, $R^2$, $R^3$ and $R^4$ can be the same or different and are hydrogen, alkyl, alkenyl, alkynyl, heteroalkyl, aryl, or heteroaryl, or optionally any number of $R^1$, $R^2$, $R^3$ and/or $R^4$ can be joined together or with an atom from A or B to form one or more rings, or optionally any one of $R^1$, $R^2$, $R^3$ and $R^4$ is absent according to standard valance requirements. For example, $R^1$ and $R^3$ may be joined together and form a phenyl ring, and thus, $R^2$ and $R^4$ are absent. In some embodiments, a is 1. In some cases, Z is C. In some cases, Z is a heteroatom. In some cases, Z is N. In some cases, $R^1$-$R^4$ are each H.

In some cases A is a 5-membered or 6-membered aromatic or heteroaromatic ring, optionally substituted, and optionally associated with a ring system. In some cases, B is a 5-membered or 6-membered heteroaromatic ring comprising at least one nitrogen atom, optionally substituted, and optionally associated with a ring system. In some cases, the B ring comprises the structure:

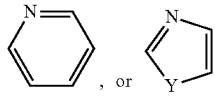, or wherein Y is a heteroatom (e.g., O, S). In some cases, Y is O. In some cases, Y is S. In some cases, the A ring comprises phenyl.

In some cases, the at least one repeating unit comprising a three-ring system containing at least one quaternary nitrogen has the structure:

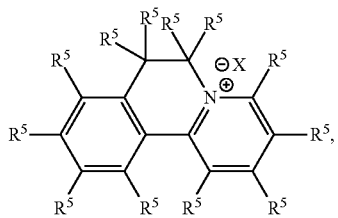

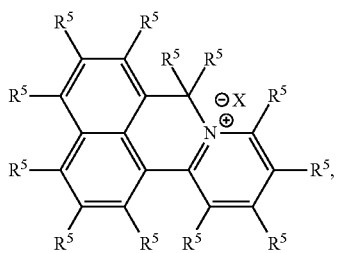

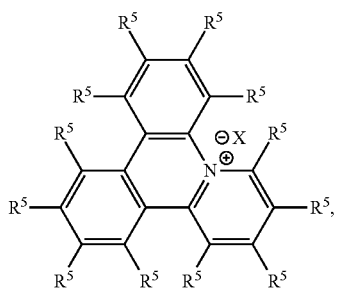

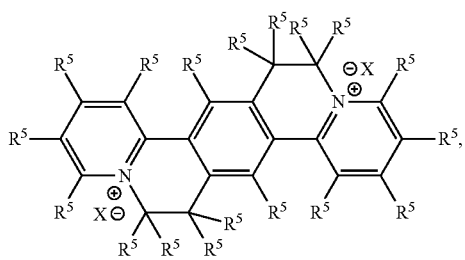

wherein each $R^5$ can be the same or different and is a suitable substituent, may join together with another $R^5$ to form a ring, and/or may form a bond with another repeating unit and/or an end-group of the polymer, in accordance with standard valence requirements, and each Y can be the same or different and is a heteroatom. In some embodiments, each $R^5$ can be the same or different and is H, alkyl, alkenyl, alkynyl, heteroalkyl, aryl, heteroaryl, acyl, OH, each optionally substituted. In some embodiments, at least two $R^5$ form a bond to another repeating unit and/or an end-group of the polymer. In some cases, at least at least two $R^5$ form a bond to another repeating unit and/or an end-group of the polymer and each additional $R^5$ is H. In some embodiments, each Y is O or S.

Those of ordinary skill in the art will be aware of possible substitutions and/or absences of groups in accordance with standard valence requirements. For example, a carbon atom generally forms four bonds with two (e.g., RC≡CR), three (e.g., $R_2C$=$CR_2$), or four (e.g., $CR_4$) groups. In some cases, each of the carbon atoms of a ring system which has an open valance position may form a bond with another polymeric unit or an endgroup, or alternatively, may be H, alkyl, alkenyl, alkynyl, heteroalkyl, aryl, heteroaryl, acyl, or OH, each optionally substituted. In some cases, a group may not be present in the presence of the group would cause the atom to which it is attached to exceed standard valance requirements.

In some cases, the repeating unit has the structure:

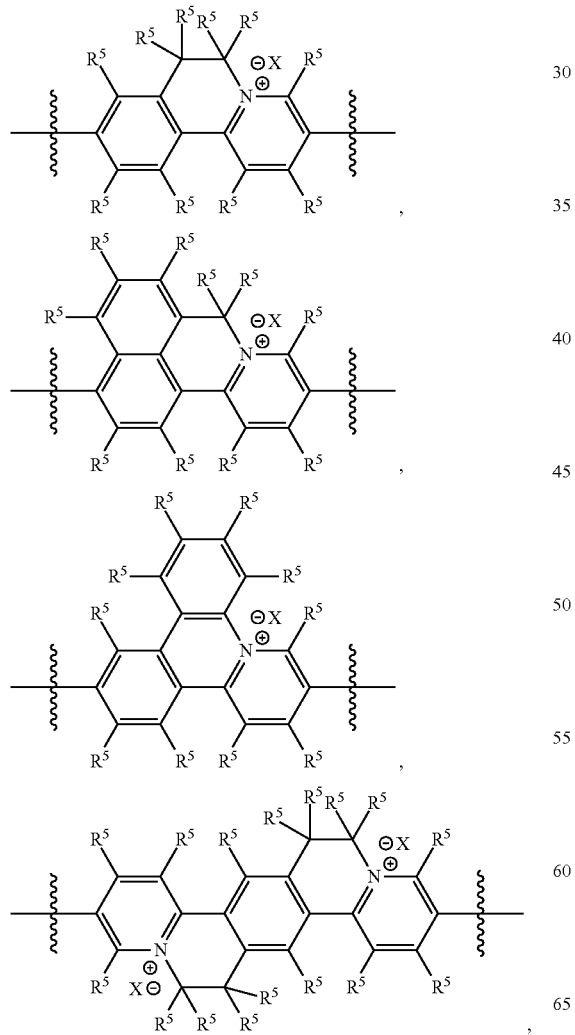

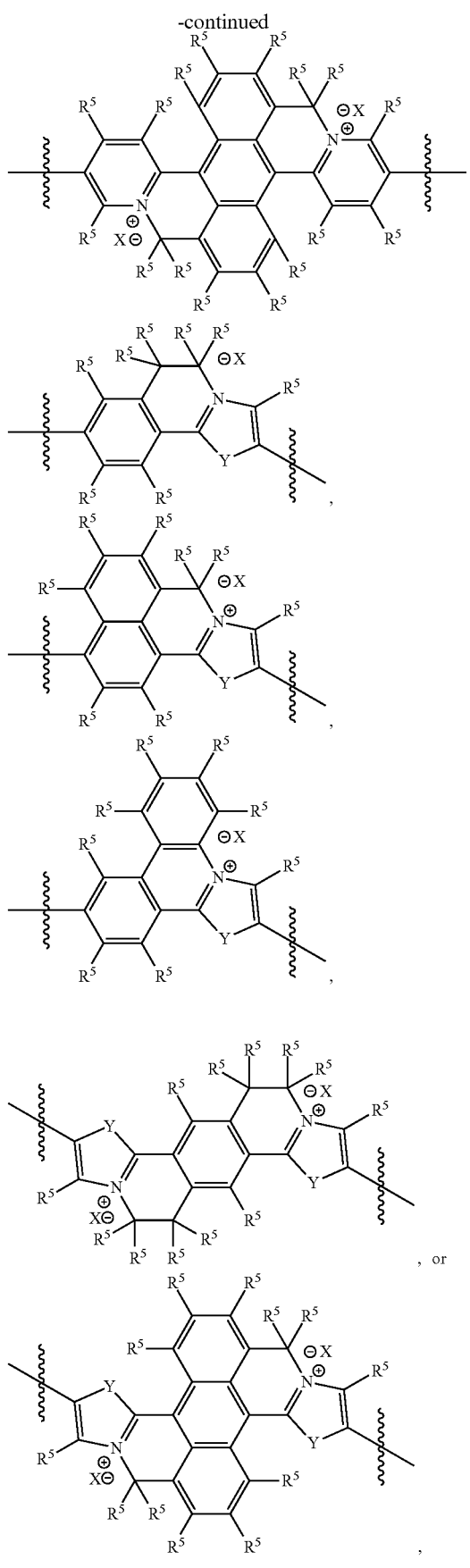

wherein  indicates the location of the bond to another repeating unit or an end-group, and Y and $R^5$ are as defined herein. In some cases, each $R^5$ is H and Y is S or O.

Those of ordinary skill in the art will be aware of suitable anionic species to use in connection with the polymers and methods of the present invention. In addition, those of ordinary skill in the art will be aware that the anionic species may have a change of greater than (−1) (e.g., (−2), (−3)). Non-limiting examples of suitable anionic species include halides (e.g., chloride, bromide, iodide, fluoride), nitrates, sulfates (e.g., tosylate, mesylate, etc.), phosphates (e.g., $H_2PO_3^-$, $PF_6^-$, etc.), carboxylates, and acetates. In a particular embodiment, the anionic species is a halide.

It should be understood, that all polymers described herein may optionally comprise one or more end-groups. The term "end-group" is given its ordinary meaning in the art and refers to a chain-terminating functional group at the end of the polymer.

In some embodiments, a homopolymer may be formed comprising one or more of the repeating units described herein. The term "homopolymer" is given its ordinary meaning in the art and refers to a polymers formed from and/or containing a single type of monomer.

In some cases, a copolymer may be formed comprising one or more of the repeating units described herein. The term "copolymer" includes polymers containing groups or units derived from two or more repeating units. The repeating units forming the copolymer may be arranged in any fashion. For example, the repeating units may be arranged in a random order, in an alternating order, or as a "block" copolymer, i.e., comprising one or more regions each comprising a first repeating unit (e.g., a first block), and one or more regions each comprising a second repeating unit (e.g., a second block), etc. Block copolymers may have two (a diblock copolymer), three (a triblock copolymer), or more numbers of distinct blocks. The repeating units of a certain type may or may not be situated relative to each other (e.g., the ordering of the repeating units may or may not be random).

In some embodiments, a polymeric composition comprises a copolymer comprising the structure:

$$-[C-D]_m,$$

wherein C is a first type of repeating unit (e.g., as described herein), D is a different second type of repeating unit, and m is an integer and is 1 or greater. In some cases, m is between 1 and 1,000,000, or between 1 and 100,000, or between 10 and 500,000, or between 100 and 100,000, etc. The second type of repeating unit may be any suitable unit. In some cases, the second type of repeating unit comprises an aromatic structure, for example, ring or ring systems including aryl rings and heterocycles (e.g., furans, thiophenes, pyrroles, etc.). In some cases, the second type of repeating unit may be pi-accessible.

In some cases, the C repeating unit may function as electron-acceptor units and the D repeating units may function as electron-donor units (e.g., wherein D is selected to be electron-donating). In such cases, the donor-acceptor copolymers may exhibit small optical band gaps (e.g., as described herein, for example, between 0.5 eV and about 1.5 eV), broad absorption bands that extend into the near IR, ambipolar redox properties with large electron affinities (e.g., between about 3.8 eV and about 4.1 eV), and/or high conductivities (e.g., greater than 150 S/cm).

In some embodiments, a polymeric composition comprises a block copolymer comprising a first type of repeating unit and a different second type of repeating unit. In some cases, a di-block copolymer is provided comprising the structure:

wherein C is a first type of repeating unit (e.g., as described herein) and D is a different second type of repeating unit, and m and n can be the same or different and each is an integer and is 1 or greater. In some cases, each of n and m are the same or different and are between 1 and 1,000,000, or between 1 and 100,000, or between 10 and 500,000, or between 100 and 100,000, etc.

In some cases, the second type of repeating unit D has the structure:

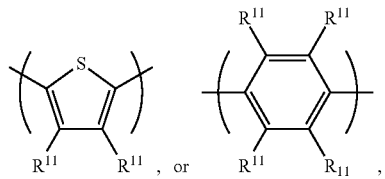

wherein each $R^{11}$ is the same or different and is hydrogen, alkyl, heteroalkyl, or aryl, each optionally substituted. In some cases, each $R^5$ is the same or different and is hydrogen or alkyl, optionally substituted.

In some cases, the second type of repeating unit may be selected such that it is strongly electron-donating as compared to the first type of repeating unit. For example, the polymer (e.g., C unit)) of the present invention may function as an n-type material and the second type of polymer (e.g., D unit) may function as a p-type material, thereby forming p/n-type materials and/or p/n-type bulk heterojunctions. Such materials may provide advantages when employed in certain devices, as described herein. In some cases, the polymers exhibit reversible viologen-like behavior and/or reversible ambipolar redox properties.

In some cases, the strongly electron-donating second type of repeating unit may have the structure:

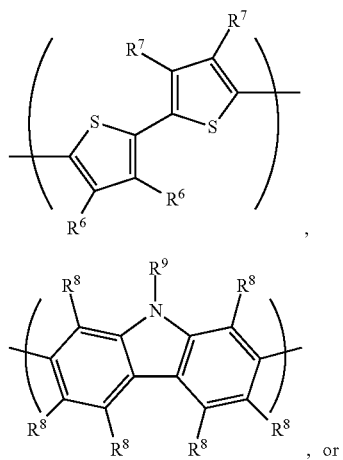

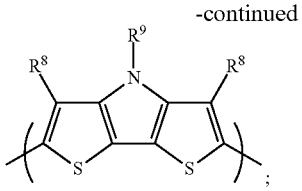

wherein each $R^6$ is the same or different and is hydrogen, alkyl, heteroalkyl, aryl, heteroaryl, haloalkyl, $OR^{10}$, each optionally substituted, or optionally joined together to form a ring; each $R^7$ is the same or different and is hydrogen, alkyl, heteroalkyl, aryl, heteroaryl, haloalkyl, $OR^{10}$, each optionally substituted, or optionally joined together to form a ring; each $R^8$ and each $R^9$ is the same or different and is hydrogen, alkyl, heteroalkyl, aryl, heteroaryl, haloalkyl, $OR^{10}$, each optionally substituted; and each $R^{10}$ is the same or different and is H, alkyl, heteroalkyl, aryl, heteroaryl, each optionally substituted. Non-limiting examples of appropriate repeating units include:

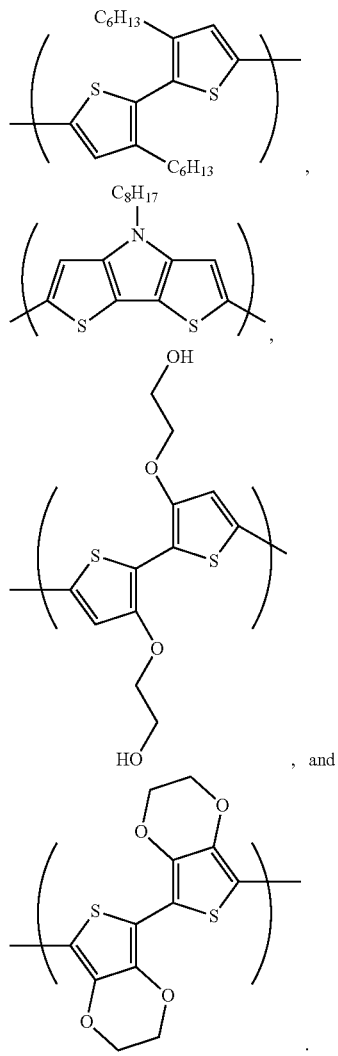

In some embodiments, the block polymer (e.g., block copolymers, triblock copolymers, etc.) may exhibit microphase separation. The term "microphase separation" is given its ordinary meaning in the art and refers to a process in which blocks of the copolymer are locally segregated to form ordered domains.

The polymeric compositions of the present invention may have a variety of properties which may be advantageous when the materials are employed in certain applications. In some cases, the polymer (e.g., comprising a plurality of charges (e.g., quaternary nitrogens)) may be soluble or substantially soluble in water, protic solvents, and/or polar organic solvents, and insoluble or substantially insoluble in aprotic solvents and/or non-polar organic solvents. The solubility profile may be advantageous when forming alternating layers of thin films of the polymers of the present invention and a second type of polymer (e.g., an n-type polymer), wherein the second type of polymer has an opposite solubility profile (e.g., insoluble or substantially insoluble in water, protic solvents, and/or polar organic solvents, and soluble or substantially soluble in aprotic solvents and/or non-polar organic solvents).

In some cases, the polymers of the present invention may be capable of functioning as both p-type materials and n-type materials (e.g., see FIGS. 11d and 11f)

In some embodiments, a polymeric composition (e.g., a copolymer) exhibits a $\lambda_{max}$ greater than about 400 nm, about 500 nm, about 550 nm, about 600 nm, about 650 nm, or between about 400 nm and about 800 nm, or between about 450 nm and about 750 nm, or between about 400 nm and about 700 nm, or between about 500 nm and about 700 nm, or between about 600 nm and about 700 nm.

In some embodiments, a polymeric composition (e.g., a copolymer) exhibits a band gap of less than about 2.5 eV, less than about 2.0 eV, less than about 1.5 eV, less than about 1.0 eV, less than about 0.5 eV, or between about 0.5 eV and about 3.0 eV, or between about 1.0 eV and about 3 eV, or between about 1.0 eV and about 2.0 eV, or between about 0.5 eV and about 1.5 eV.

In some embodiments, a polymeric composition (e.g., a copolymer) exhibits an electron affinity of at least about 3.5 eV, at least about 3.6 eV, at least about 3.7 eV, at least about 3.8 eV, at least about 3.9 eV, at least about 4.0 eV, or between about 3.5 eV and about 4.5 eV, or between about 3.6 eV and about 4.4 eV, or between about 3.7 eV and about 4.3 eV, or between about 3.8 eV and about 4.2 eV, or between about 3.9 eV and about 4.1 eV.

In some cases, a polymeric composition (e.g., a copolymer) exhibits a conductivity of at least about 60 S/cm, at least about 80 S/cm, at least about 100 S/cm, at least about 120 S/cm, at least about 140 S/cm, at least about 160 S/cm, at least about 180 S/cm, at least about 200 S/cm, or between about 80 S/cm and about 220 S/cm, or between about 100 S/cm and about 200 S/cm, or between about 120 S/cm and about 200 S/cm, or between about 140 S/cm and about 200 S/cm.

In some embodiments, the present invention provides methods for transforming polymers. In some cases, a method comprises exposing a polymer that is substantially neutral under suitable conditions to form a polymer which is highly charged. For example, the transformation may comprise a cyclization reaction of a portion of the polymer backbone, thereby forming a plurality of quaternary nitrogen atoms in the polymer backbone.

In some embodiments, a method of the present invention comprises providing a polymer comprising at least one repeating unit, wherein at least a portion of the repeating unit has the structure:

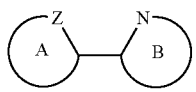

wherein A is a ring or a portion of a ring system, optionally comprising at least one heteroatom, and optionally substituted; B is a ring or a portion of a ring system, wherein the ring system comprises N and, optionally, at least one additional heteroatom, and optionally substituted; Z is C or a heteroatom. In some cases, Z is C. In some cases, Z is a heteroatom. In some cases, Z is N. The polymer may be subjected to suitable conditions, thereby transforming the polymer, wherein after transformation the at least one repeating unit has the structure:

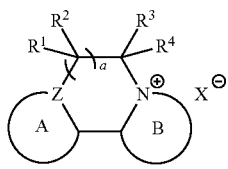

wherein $X^{\ominus}$ is an anionic species; a is 0, 1, 2, or 3; and $R^1$, $R^2$, $R^3$ and $R^4$ can be the same or different and are hydrogen, alkyl, alkenyl, alkynyl, heteroalkyl, aryl, or heteroaryl, or optionally any number of $R^1$, $R^2$, $R^3$, and/or $R^4$ can be joined together or with an atom from A or B to form one or more rings, or optionally any one of $R^1$, $R^2$, $R^3$, and $R^4$ is absent according to standard valance requirements. $X^{\ominus}$, a, $R^1$, $R^2$, $R^3$, and $R^4$ may also be as defined herein.

In some cases, prior to the transformation, the at least a portion of the repeating unit may have the structure:

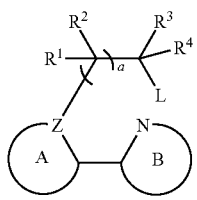

wherein L is a leaving group. The term "leaving group" is given its ordinary meaning in the art and refers to an atom or a group capable of being displaced by a nucleophile. Non-limiting examples of suitable leaving groups include halides (such as chloride, bromide, and iodide), alkanesulfonyloxy, arenesulfonyloxy, alkyl-carbonyloxy (e.g., acetoxy), arylcarbonyloxy, mesyloxy, tosyloxy, trifluoromethane-sulfonyloxy, aryloxy (e.g., 2,4-dinitrophenoxy), methoxy, N,O-dimethylhydroxylamino, pixyl, and the like. In some embodiments, L is $OSiR'_3$, OH, CL, BR, I, O-tosyl, O-mesyl, or $OPO(OR')_2$ wherein R' is H, alkyl, heteroalkyl, aryl, or heteroaryl, each optionally substituted.

In some cases, prior to transformation, the at least a portion of the repeating unit has the structure:

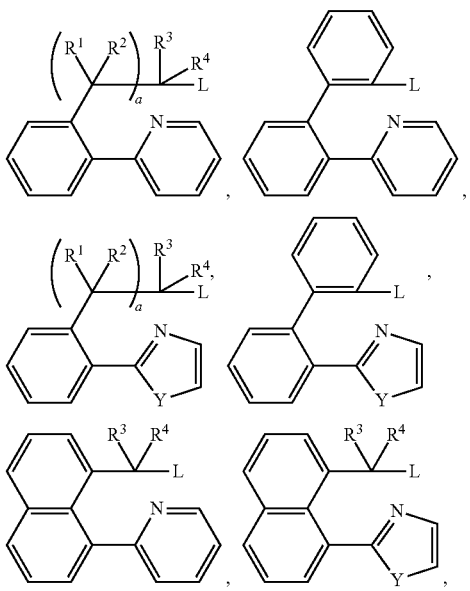

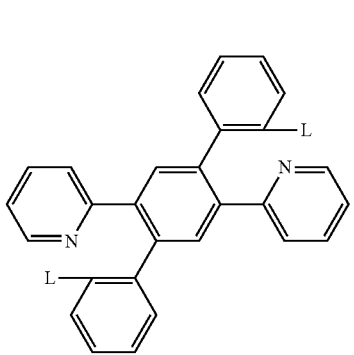

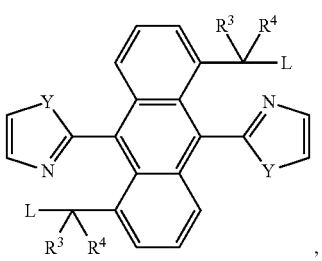

-continued

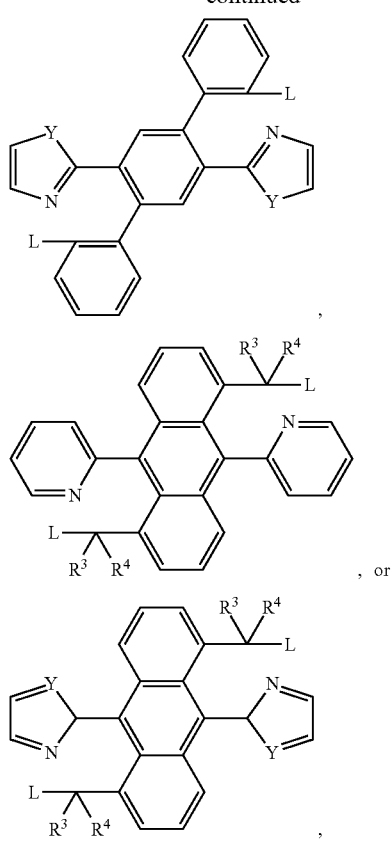
, or wherein each unsubstituted position of each structure may be optionally substituted and/or may form a bond with another repeating unit and/or an end-group of the polymer, in accordance with standard valence requirements, as will be understood by those of ordinary skill in the art.

In some embodiments, after transformation, the at least a portion of the repeating unit may have the structure:

-continued

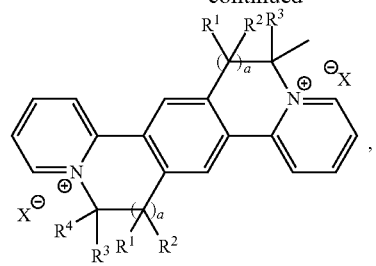
,

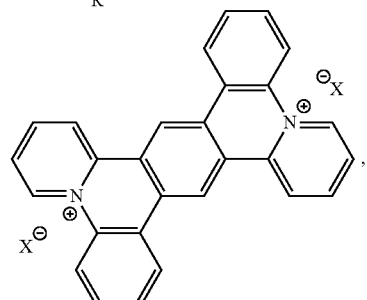
,

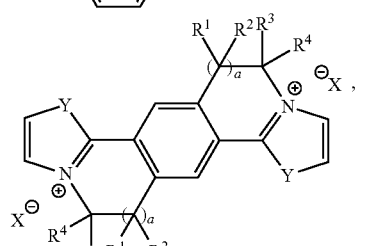
,

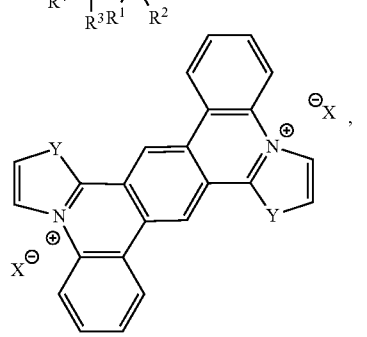
,

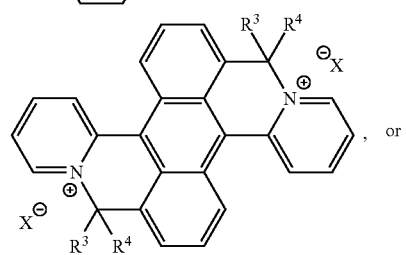
, or

Figures 1, 16:
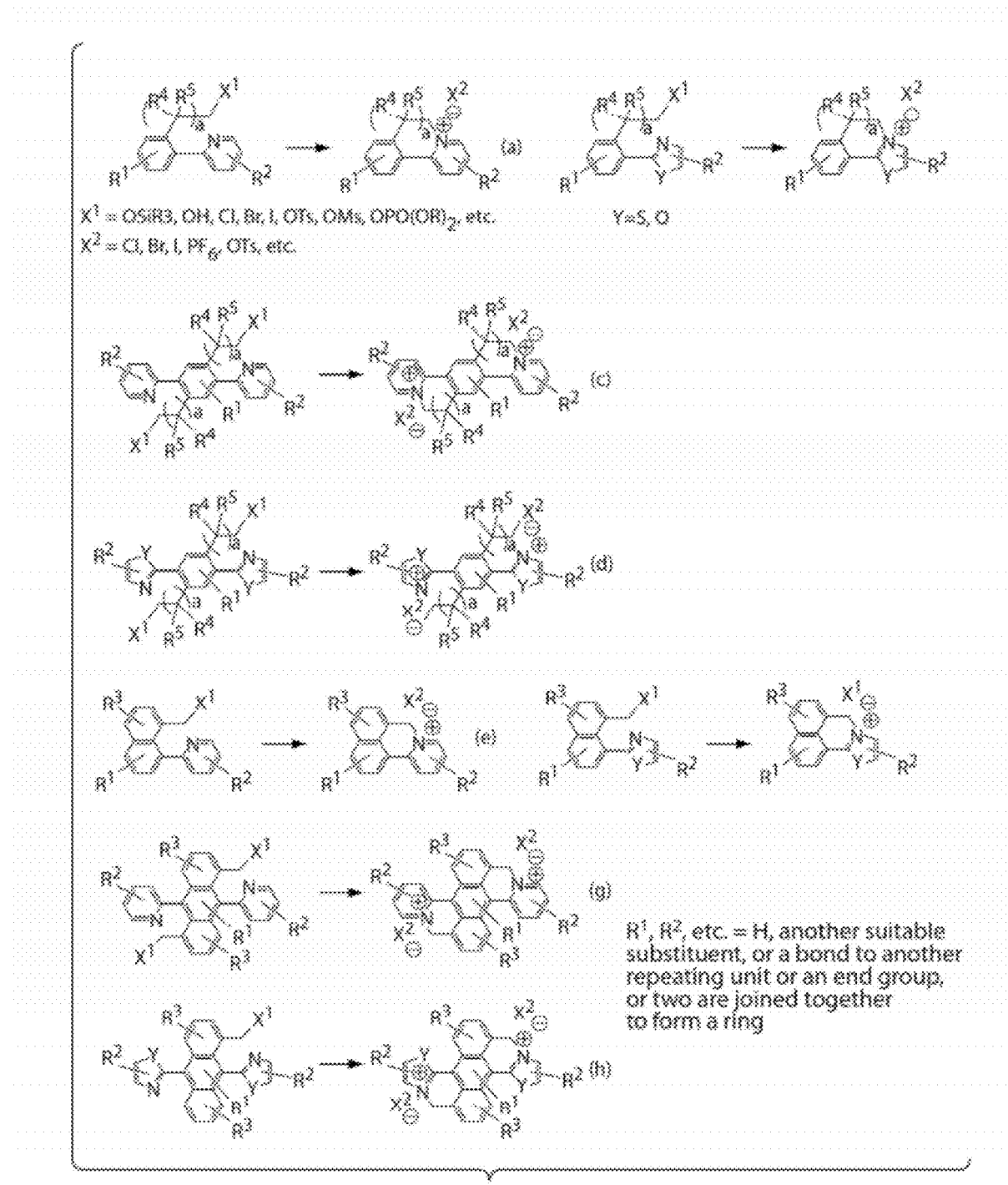
FIG. 16 illustrates non-limiting example of transformations of polymers, according to some embodiments.
Figures 2, 16:
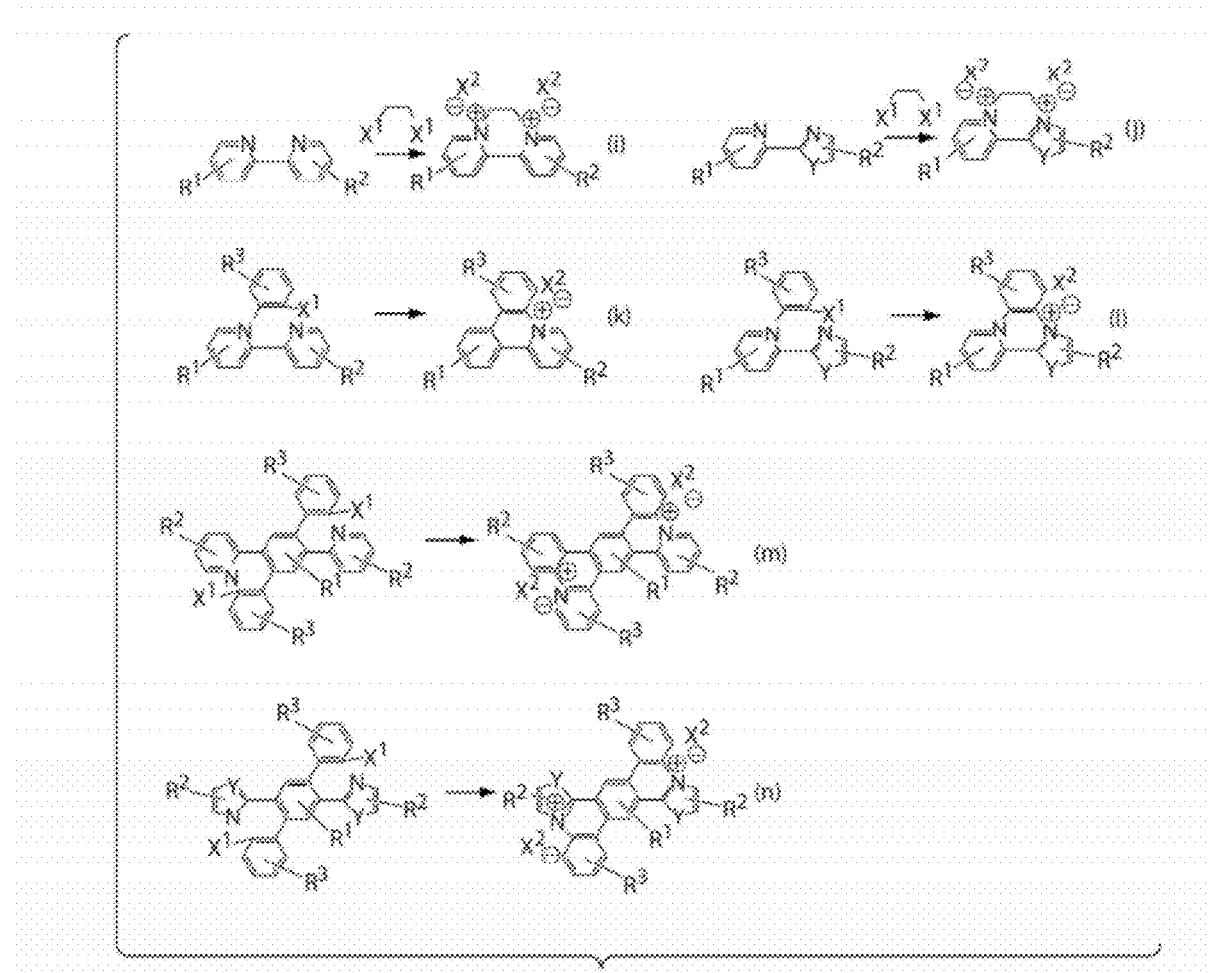

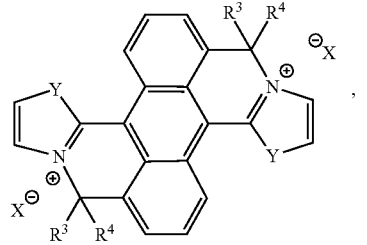
, wherein each unsubstituted position of each structure may be optionally substituted and/or may form a bond with another repeating unit and/or an end-group of the polymer, in accordance with standard valence requirements, as will be understood by those of ordinary skill in the art. Non-limiting examples of structures before and after transformation are shown in FIG. 16.

In some embodiments, the A-B portion of the at least a portion of the repeating unit prior to transformation has the structure:

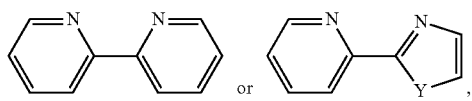

wherein each unsubstituted position of each structure may be optionally substituted and/or may form a bond with another repeating unit and/or an end-group of the polymer, in accordance with standard valence requirements, as will be understood by those of ordinary skill in the art. Accordingly, following transformation, the at least a portion of the repeating unit may have the

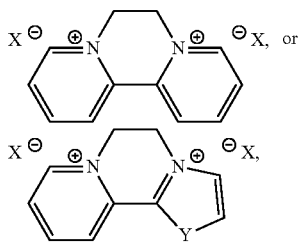

respectively, wherein each unsubstituted position of each structure may be optionally substituted and/or may form a bond with another repeating unit and/or an end-group of the polymer, in accordance with standard valence requirements.

The polymers of the present invention may be formed using any suitable technique. Generally, the polymers are formed by polymerization of a plurality of monomers. In some cases, a polymer (e.g., a polymer precursor) is formed, followed by transformation of the polymer (e.g., cyclization to form a quaternary nitrogen). However, it should be understood that the monomers may be transformed (e.g., cyclization to form a quaternary nitrogen) prior to polymerization and/or a portion of the polymer may be formed (e.g., a block comprising a plurality of monomers to be transformed), followed by transformation, followed by incorporation of the block into a block copolymer.

In some embodiments, the polymerization reaction is a metal-catalyzed reaction (e.g., palladium-catalyzed. In some cases, the polymers are formed prior to transformation using Yamamoto, Suzuki, and/or Stille coupling polymerization reactions (e.g., see FIG. 1, FIG. 10). Following formation of the polymer, the polymer may be transformed by exposing the polymer to a suitable reagents/conditions. In some cases, the transformation involves a cyclization reaction, for example, an intramolecular nucleophilic substitution reaction. In some cases, the polymer may transform upon exposure to thionyl chloride (e.g., see FIG. 1, FIG. 10), thereby forming a cyclic pyridinium. As another example, the polymer may transform upon exposure to tetra-n-butylammonium fluoride/n-$C_4F_9SO_2F$. Those of ordinary skill in the art will be aware of other suitable reagents/conditions.

In some embodiments, films are provided comprising a polymeric composition as described herein and/or a polymeric composition produced using a method described herein. The films may be incorporated into devices such as photovoltaic cells, field-effect transistors, and light emitting diodes. Films may be formed using techniques known to those of ordinary skill in the art. For example, a film may be formed by spin-casting method, drop-casting method, dip coating method, roll coating method, screen coating method, a spray coating method, screen printing method, ink-jet method, and the like. In some cases, the thickness of the film may be less than about 1000 um, less than 100 um, less than about 10 um, less than about 1 um, less than about 100 nm, less than about 10 nm, less than about 1 nm, or thinner. In some cases, the film may have a thickness greater than 1 mm. In some cases, the film may have a substantially uniform thickness over a large surface area (e.g., greater than 200 $nm^2$). A film having a "substantially uniform" thickness may refer to a film having a thickness which deviates less than about 20%, less than about 10%, less than about 5%, or, in some cases, less than about 2%, from an average thickness of the film. In some cases, the material may have a substantially uniform thickness over a surface area of at least about 200 $nm^2$, about 300 $nm^2$, about 400 $nm^2$, about 500 $nm^2$, or, in some cases, greater.

The compositions of the present invention may find use in a variety of applications. In some embodiments, the composition may be employed in electronic devices, for example photovoltaic cells, field-effect transistors, light emitting diodes, sensors, etc. Those of ordinary skill in the art will be aware of such devices, suitable components for such devices, and techniques for forming such devices. In some cases, a device may comprise a film of a polymeric composition described herein and/or a polymeric composition produced using a method described herein.

Photovoltaic cells will be known to those of ordinary skill in the art and generally comprise at least a photoactive composition (e.g., a composition as described herein), and at least two electrode (e.g., an anode and a cathode). The system may optionally comprise at least one substrate (e.g., on which to form the anode and/or cathode), electron-blocking and/or electron-transporting membrane(s), circuitry, power source, and/or electromagnetic radiation source. In some cases, the photoactive composition is positioned between two electrodes. Those of ordinary skill in the art will be aware of appropriate materials to use as the anode and/or cathode. Methods are known in the art to prepare photovoltaic devices.

The photovoltaic cells of the present invention may be exposed to light using methods known to those of ordinary skill in the art. The light may interact with the composition of the present invention, causing electrons to be transferred from the p-type material (e.g., electron-donating material) to the n-type material (e.g., electron-accepting material). The electrons in the n-type material can be transported to the cathode and the corresponding holes can be transported to the anode via the p-type material.

In some cases, a polymeric composition of the present invention and/or a polymeric composition formed using the methods of the present invention may be comprised in a field-effect transistor (FET). The term field-effect transistor is given its ordinary meaning in the art and refers to a transistor, whose current carrying characteristics are affected by a voltage on a gate electrode.

The methods of various embodiments of the present invention may be carried out in any suitable solvent, or combination thereof. Examples of solvents that may be suitable for use in the invention include, but are not limited to, water, dimethoxyethane, dimethylsulfoxide, tetrahydrofuran, benzene, p-cresol, toluene, xylene, mesitylene, diethyl ether, glycol, petroleum ether, hexane, cyclohexane, pentane, dichloromethane (or methylene chloride), chloroform, carbon tetrachloride, dioxane, dimethylformamide, hexamethylphosphoric triamide, ethyl acetate, pyridine, triethylamine, picoline, mixtures thereof, or the like.

The methods of various embodiments of the present invention may be carried out at any suitable temperature(s). In some cases, the reaction is carried out at about room temperature (e.g., about 25° C., about 20° C., between about 20° C. and about 25° C., or the like). In some cases, however, the reaction may be carried out at a temperature below or above room temperature, for example, at about −70° C., about −50° C., about −30° C., about −10° C., about −0° C., about 10° C., about 30° C., about 40° C., about 50° C., about 60° C., about 70° C., about 80° C., about 90° C., about 100° C., about 120° C., about 140° C., or the like. In some embodiments, the reaction may be carried out at more than one temperature (e.g., reactants added at a first temperature and the reaction mixture agitated at a second wherein the transition from a first temperature to a second temperature may be gradual or rapid).

A reaction may be allowed to proceed for any suitable period of time. In some cases, the reaction is allowed to proceed for about 10 minutes, about 20 minutes, about 30 minutes, about 40 minutes, about 50 minutes, about 1 hour, about 2 hours, about 4 hours, about 8 hours, about 12 hours, about 16 hours, about 24 hours, about 28 hours, or the like. In some cases, aliquots of the reaction mixture may be removed and analyzed at an intermediate time to determine the progress of the reaction.

A variety of definitions are now provided which may aid in understanding various aspects of the invention.

In general, the term "aliphatic," as used herein, includes both saturated and unsaturated, straight chain (i.e., unbranched) or branched aliphatic hydrocarbons, which are optionally substituted with one or more functional groups, as defined below. As will be appreciated by one of ordinary skill in the art, "aliphatic" is intended herein to include, but is not limited to, alkyl, alkenyl, alkynyl moieties. Illustrative aliphatic groups thus include, but are not limited to, for example, methyl, ethyl, n-propyl, isopropyl, allyl, n-butyl, sec-butyl, isobutyl, tert-butyl, n-pentyl, sec-pentyl, isopentyl, tert-pentyl, n-hexyl, sec-hexyl, moieties and the like, which again, may bear one or more substituents, as previously defined.

As used herein, the term "alkyl" is given its ordinary meaning in the art and may include saturated aliphatic groups, including straight-chain alkyl groups, branched-chain alkyl groups, cycloalkyl (alicyclic) groups, alkyl substituted cycloalkyl groups, and cycloalkyl substituted alkyl groups. An analogous convention applies to other generic terms such as "alkenyl," "alkynyl," and the like. Furthermore, as used herein, the terms "alkyl," "alkenyl," "alkynyl," and the like encompass both substituted and unsubstituted groups.

In some embodiments, a straight chain or branched chain alkyl may have 30 or fewer carbon atoms in its backbone, and, in some cases, 20 or fewer. In some embodiments, a straight chain or branched chain alkyl has 12 or fewer carbon atoms in its backbone (e.g., $C_1$-$C_{12}$ for straight chain, $C_3$-$C_{12}$ for branched chain), has 6 or fewer, or has 4 or fewer. Likewise, cycloalkyls have from 3-10 carbon atoms in their ring structure or from 5, 6 or 7 carbons in the ring structure. Examples of alkyl groups include, but are not limited to, methyl, ethyl, propyl, isopropyl, cyclopropyl, butyl, isobutyl, tert-butyl, cyclobutyl, hexyl, cyclohexyl, and the like. In some cases, the alkyl group might not be cyclic. Examples of non-cyclic alkyl include, but are not limited to, methyl, ethyl, propyl, isopropyl, n-butyl, tert-butyl, n-pentyl, neopentyl, n-hexyl, n-heptyl, n-octyl, n-decyl, n-undecyl, and dodecyl.

The terms "alkenyl" and "alkynyl" refer to unsaturated aliphatic groups analogous in length and possible substitution to the alkyls described above, but that contain at least one double or triple bond respectively. Alkenyl groups include, but are not limited to, for example, ethenyl, propenyl, butenyl, 1-methyl-2-buten-1-yl, and the like. Non-limiting examples of alkynyl groups include ethynyl, 2-propynyl (propargyl), 1-propynyl, and the like.

The terms "heteroalkenyl" and "heteroalkynyl" refer to unsaturated aliphatic groups analogous in length and possible substitution to the heteroalkyls described above, but that contain at least one double or triple bond respectively.

As used herein, the term "halogen" or "halide" designates —F, —Cl, —Br, or —I.

The term "aryl" refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated Pi electron system, while other, adjoining rings can be cycloalkyls, cycloalkenyls, cycloalkynyls, aryls, and/or heterocycyls. The aryl group may be optionally substituted, as described herein. "Carbocyclic aryl groups" refer to aryl groups wherein the ring atoms on the aromatic ring are carbon atoms. Carbocyclic aryl groups include monocyclic carbocyclic aryl groups and polycyclic or fused compounds (e.g., two or more adjacent ring atoms are common to two adjoining rings) such as naphthyl group. Non-limiting examples of aryl groups include phenyl, naphthyl, tetrahydronaphthyl, indanyl, indenyl and the like.

The terms "heteroaryl" refers to aryl groups comprising at least one heteroatom as a ring atom, such as a heterocycle. Non-limiting examples of heteroaryl groups include pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like.

It will also be appreciated that aryl and heteroaryl moieties, as defined herein, may be attached via an aliphatic, alicyclic, heteroaliphatic, heteroalicyclic, alkyl or heteroalkyl moiety and thus also include -(aliphatic)aryl, -(heteroaliphatic)aryl, -(aliphatic)heteroaryl, -(heteroaliphatic)heteroaryl, -(alkyl)aryl, -(heteroalkyl)aryl, -(heteroalkyl)aryl, and -(heteroalkyl)-heteroaryl moieties. Thus, as used herein, the phrases "aryl or heteroaryl" and "aryl, heteroaryl, (aliphatic) aryl, -(heteroaliphatic)aryl, -(aliphatic)heteroaryl, -(heteroaliphatic)heteroaryl, -(alkyl)aryl, -(heteroalkyl)aryl, -(heteroalkyl)aryl, and -(heteroalkyl)heteroaryl" are interchangeable.

The term "arylalkyl," as used herein, refers to a group comprising an aryl group attached to the parent molecular moiety through an alkyl group.

The term "arylheteroalkyl," as used herein, refers to a group comprising an aryl group attached to the parent molecular moiety through a heteroalkyl group.

The term "heteroarylalkyl," as used herein, refers to a group comprising a heteroaryl group attached to the parent molecular moiety through an alkyl group.

Any of the above groups may be optionally substituted. As used herein, the term "substituted" is contemplated to include all permissible substituents of organic compounds, "permissible" being in the context of the chemical rules of valence known to those of ordinary skill in the art. It will be understood that "substituted" also includes that the substitution results in a stable compound, e.g., which does not spontaneously undergo transformation such as by rearrangement, cyclization, elimination, etc. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl group" must still comprise the phenyl moiety and can not be modified by substitution, in this definition, to become, e.g., a pyridine ring. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms.

Examples of substituents include, but are not limited to, aliphatic, alicyclic, heteroaliphatic, heteroalicyclic, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, heteroalkylthio, heteroarylthio, sulfonyl, sulfonamido, ketone, aldehyde, ester, heterocyclyl, aromatic or heteroaromatic moieties, —$CF_3$, —CN, aryl, aryloxy, perhaloalkoxy, aralkoxy, heteroaryl, heteroaryloxy, heteroarylalkyl, heteroaralkoxy, azido, amino, halide, alkylthio, oxo, acylalkyl, carboxy esters, -carboxamido, acyloxy, aminoalkyl, alkylaminoaryl, alkylaryl, alkylaminoalkyl, alkoxyaryl, arylamino, aralkylamino, alkylsulfonyl, -carboxamidoalkylaryl, -carboxamidoaryl, hydroxyalkyl, haloalkyl, alkylaminoalkylcarboxy-, aminocarboxamidoalkyl-, cyano, alkoxyalkyl, perhaloalkyl, arylalkyloxyalkyl, (e.g., $SO_4(R')_2$), a phosphate (e.g., $PO_4(R')_3$), a silane (e.g., $Si(R')_4$), a urethane (e.g., R'O(CO)NHR'), and the like. Additionally, the substituents may be selected from F, Cl, Br, I, —OH, —$NO_2$, —CN, —NCO, —$CF_3$, —$CH_2CF_3$, —$CHCl_2$, —$CH_2OR_x$, —$CH_2CH_2OR_x$, —$CH_2N(R_x)_2$, —$CH_2SO_2CH_3$, —$C(O)R_x$, —$CO_2(R_x)$, —$CON(R_x)_2$, —$OC(O)R_x$, —$C(O)OC(O)R_x$, —$OCO_2R_x$, —$OCON(R_x)_2$, —$N(R_x)_2$, —$S(O)_2R_x$, —$OCO_2R_x$, —$NR_x(CO)R_x$, —$NR_x(CO)N(R_x)_2$, wherein each occurrence of $R_x$ independently includes, but is not limited to, H, aliphatic, alicyclic, heteroaliphatic, heteroalicyclic, aryl, heteroaryl, alkylaryl, or alkylheteroaryl, wherein any of the aliphatic, alicyclic, heteroaliphatic, heteroalicyclic, alkylaryl, or alkylheteroaryl substituents described above and herein may be substituted or unsubstituted, branched or unbranched, cyclic or acyclic, and wherein any of the aryl or heteroaryl substituents described above and herein may be substituted or unsubstituted.

The following examples are intended to illustrate certain embodiments of the present invention, but do not exemplify the full scope of the invention.

EXAMPLE 1

The following example describes the syntheses and electron-accepting properties of a class of water-solution processable n-type conjugated polymers (P1-1, P2-1, P3-1; see FIG. 1) with pyridinium-phenylene units that exhibit reversible electroactivity, useful electron affinities, and high electrical conductivity reported in this example. In these materials, the electron-deficient pyridinium rings are produced by an intramolecular cyclization that provides low LUMO energies and a relatively planar structure for extended π-electron delocalization. The electron transfer quenching in bilayer donor/accepter polymers heterojunctions with the well-known p-type material, poly(2-methoxy-5-(2-ethylhexyloxy)-1,4-phenylene-vinylene) (MEH-PPV) is reported.

FIG. 1 shows the synthetic routes to P1-1 and copolymers P2-1 and P3-1. A pyridyl precursor-polymer was synthesized that was then subjected to intramolecular nucleophilic substitution reactions to form the pyridinium rings. The boronation of 2,5-bis(2-(tert-butyldimethylsilyloxy)ethyl)-1,4-benzenedibromide (1-1) gives the corresponding diboronic acid bis(pinacol) ester (2-1). Head-to-head monomer 3-1, 1,4-bis[2-(5-bromopyridyl)]-2,5-bis(2-(tert-butyl dimethylsilyloxy)ethyl)benzene, was synthesized by regioselective Suzuki coupling of 2-1 with 2,5-dibromopyridine in 58% yield. Yamamoto, Suzuki, and Stille coupling polymerizations yielded high-molecular-weight siloxyethyl-substituted poly(pyridine phenylene)s, P4-1, P5-1, and P6-1, in 65-95% yield. All the precursor polymers were soluble in common organic solvents (e.g. $CHCl_3$, THF) and thionyl chloride induced quaternizative cyclization gave polyelectrolytes P1-1, P2-1, and P3-1. The polyelectrolytes were soluble in highly polar solvents, such as water and methanol, and this feature allowed for the facile formation of multi-layer polymer structures by spin-coating on top of polymers with orthogonal solubilities.

TABLE 1-1

Optical and Electrochemical Properties of P1-1, P2-1 and P3-1.

| polymer | λmax (nm) | λonset (nm) | $Eg^a$ (eV) | E red$^b$ (V) | E onset$^b$ (V) | $EA^c$ (eV) | $IP^d$ (eV) |
|---|---|---|---|---|---|---|---|
| P1-1 | 431 | 485 | 2.56 | −0.56, −1.27 | −0.40 | 4.00 | 6.56 |
| P2-1 | 376 | 420 | 2.95 | −0.71, −0.90 | −0.50 | 3.90 | 6.85 |
| P3-1 | 483 | 575 | 2.16 | −0.59, −0.99 | −0.26 | 4.14 | 6.30 |

$^a$Eg: Band gap estimated from the band edge ($λ_{onset}$) of the absorption spectra.
$^b$$E_{red}$, $E_{onset}$: Formal and onset reduction potentials (vs. SCE).
$^c$EA: Electron affinity obtained based on EA = $E_{onset}$ + 4.4 (eV).
$^d$IP: Ionization potential calculated from IP = EA + Eg (eV).

Figures 1, 6:
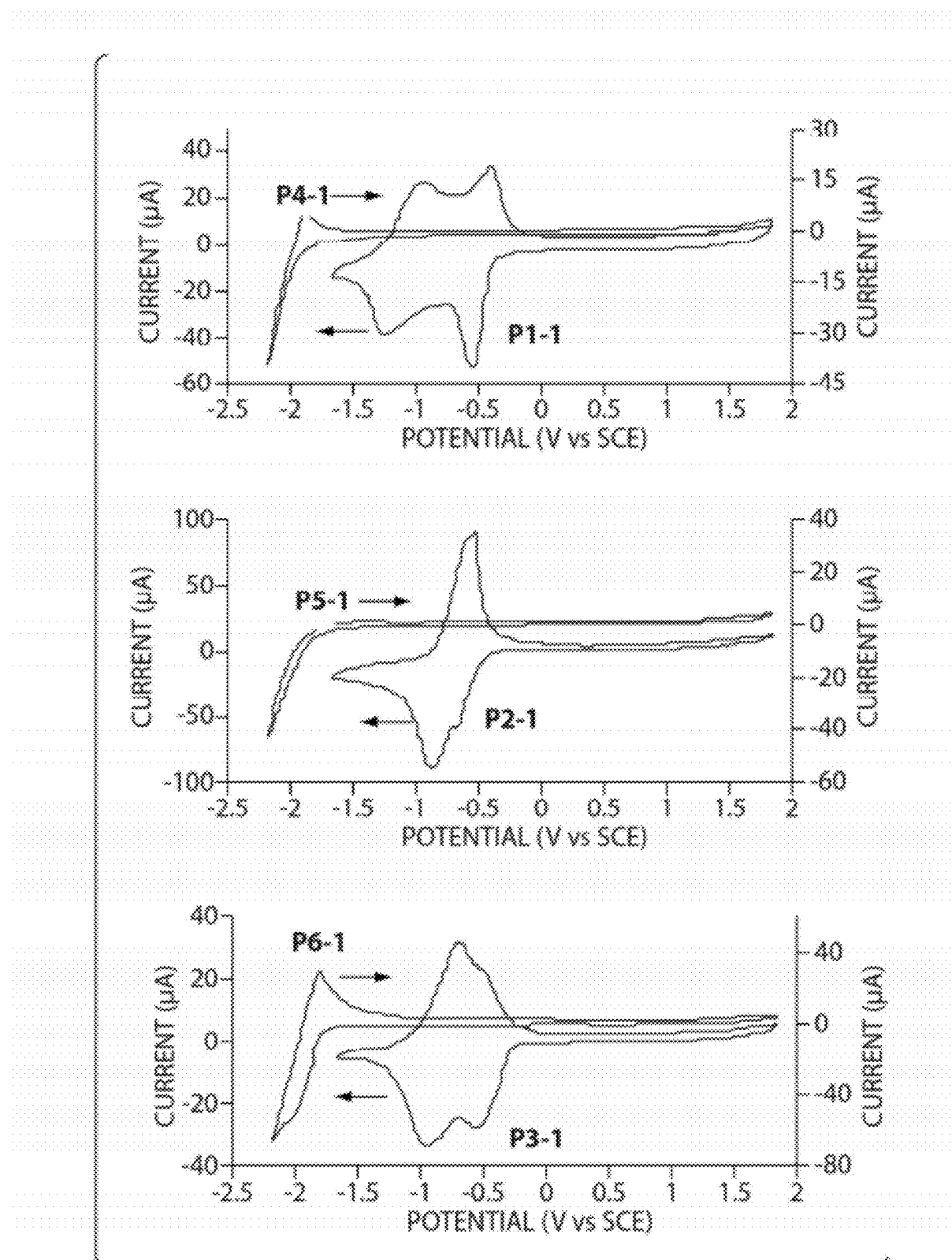
FIG. 6 shows cyclic voltammogram (left) and in-situ conductivity measurement (right) of P1-1-P6-1 thin films.
Figures 2, 6:
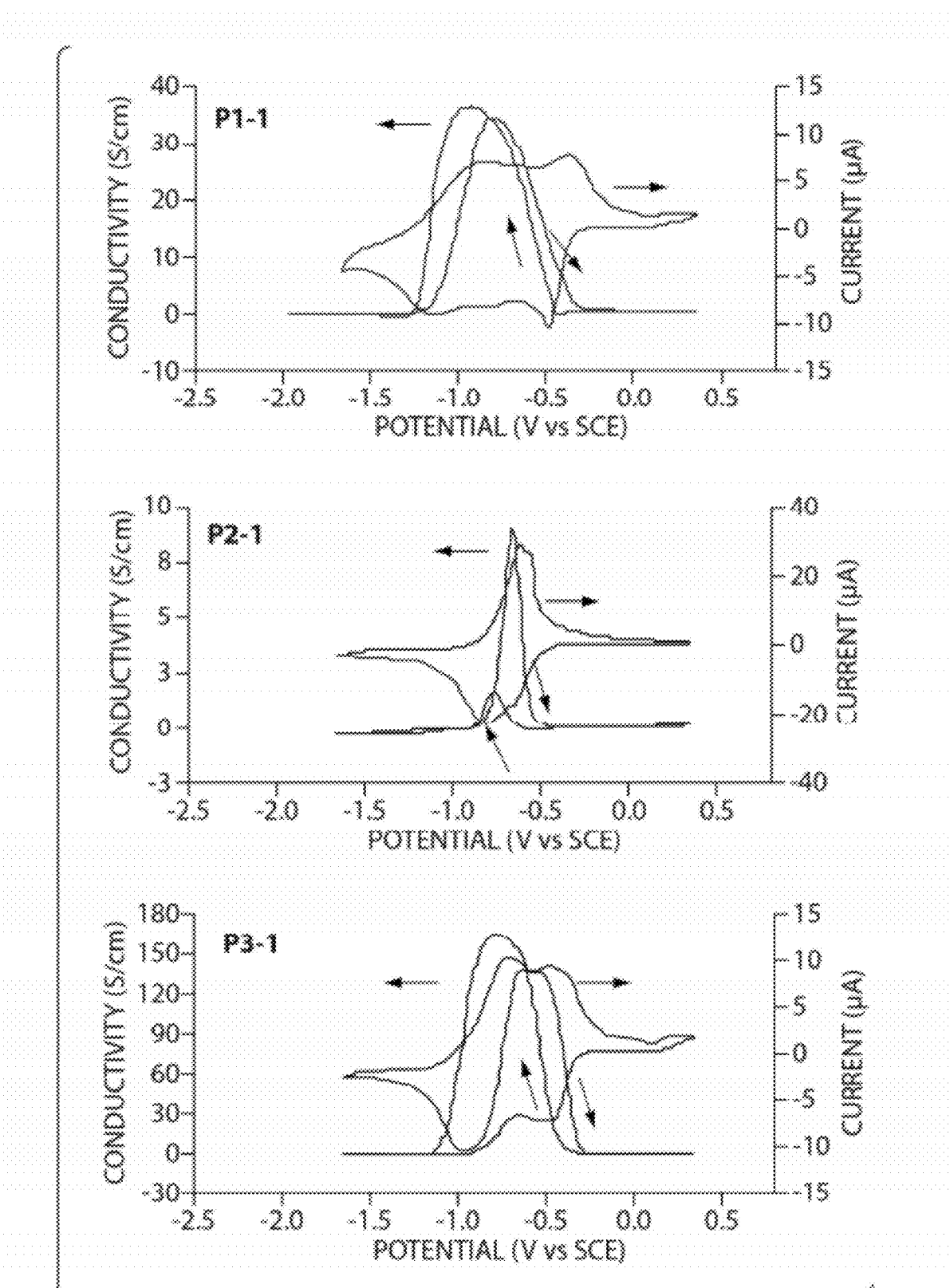
FIG. 2 shows a) UV-vis absorption spectra of thin films (continuous line) and water or methanol solutions (dashed line) of P1-1, P2-1, and P3-1; b) PL emission spectra of P1-1, P2-1, and P3-1 in water or methanol solutions; (c) cyclic voltammogram, in-situ conductivity measurement of a P1-1 thin film; and (d) spectroelectrochemistry of a P1-1 thin film.

The absorption and emission spectra of P1-1, P2-1, and P3-1 (FIGS. 2a-b) were significantly red-shifted relative to their respective precursors. This may be attributed to the two ethylene bridges enforcing a planar conformation of the bispyridinium-phenylene segment. Thin films of P3-1 displayed the smallest Eg (2.16 eV) as a result of the donor-accepter type structure as well as less steric hindrance. The electron affinities (EA) of P1-1, P2-1, and P3-1 were estimated at 3.90-4.14 eV from the onset reduction potential in cyclic voltammetry (CV) (Table 1-1). Interestingly, the EA values were higher than those estimated in the same method for most conventional polyheterocycles. In FIG. 2: (a) UV-vis absorption spectra of P1-1, P2-1, and P3-1; thin films (continuous line), water or methanol solutions (dashed line). (b) PL emission spectra of P1-1, P2-1, and P3-1 in water or methanol solutions. (c) Cyclic voltammogram, in-situ conductivity measurement, and (d) Spectroelectrochemistry of P1-1 thin film. In FIG. 3: (a) UV-vis absorption and (b) PL emission spectra ($λ_{ex}$=507 nm) of thin films of MEH-PPV, P1-1, and a bilayer of MEH-PPV/P1-1.

P1-1, P2-1, and P3-1 exhibited reversible electrochemical behavior as revealed in FIG. 2c for P1-1. The in-situ conductivity measurements of P1-1 thin films (FIG. 2c) on interdigitated microelectrodes revealed a narrow window of high conductivity ($λ_{max}$=36 S/cm at −0.96 V). Conductivity measurements on thin films of P1-1 were made difficult by the need to reduce with THF solutions of $Na^+$-naphthalide. Redox states and decreased film quality from the solvent exposure resulted in σ=1.1 S/cm, which was lower than the in situ determination. The maximum in situ conductivities of P3-1 ($\sigma_{max}$=160 S/cm) rivals values observed of well-known p-type poly(3-alkyl thiophene)s and P2-1 exhibits $\sigma_{max}$=9 S/cm. The in situ conductivity profile indicates that the 'mixed valence' state was conductive and that the neutral (fully reduced) material was insulating. The reduction of P1-1 thin films deposited onto ITO-coated glass electrodes by spectroelectrochemistry (FIG. 2d) was investigated. The absorption spectra showed a decrease of the original bandgap transition and the build-up of intra-gap energy states, which matched the negative polaron-bipolaron model for charge delocalized π-platforms.

Optical absorption and photoluminescence (PL) spectra of thin films of MEH-PPV, P1-1 and a MEH-PPV/P1-1 bilayer are shown in FIG. 3. High quality bilayer films were obtained by coating a water solution of P1-1 on the top of a MEH-PPV thin film prepared from the chloroform solution, as MEH-PPV neither dissolves nor swells in water. The absorption spectrum of bilayer heterojunction was a superposition of those of the two polymer layers, indicating no detectable ground state interaction at the heterojunction interface. FIG. 3b shows how the characteristic PL emission spectrum of MEH-PPV ($\pi_{em}$=585 nm, $\lambda_{excitation}$=507 nm) was strongly quenched (93%) in the bilayer structure with P1-1 layer (40 nm). These results indicate that the electron transfer occurs from the MEH-PPV (EA/IP=2.9/5.1 eV) to the P1-1 (EA/IP=4.0/6.6 eV). Studies of bilayer organic photovoltaic devices between P1-1 and poly(3-hexyl thiophene) gave large open circuit voltages ($V_{oc}$=1.2 V) but low short circuit currents (7 uA/cm$^2$). Field effect transistor devices of P1-1 were investigated in air and n-type behaviors with mobilities of 0.24 cm$^2$/Vs at gate voltages of 5-15V and 3.4 cm$^2$/Vs for gate voltages of 15-20 V were observed.

Materials and Methods:

General: All air and water sensitive synthetic manipulations were performed under an argon atmosphere using standard Schlenk techniques. Materials were prepared using known synthetic procedures or purchased from commercial sources. Polymer molecular weights and polydispersity indexes were estimated by gel permeation chromatography (GPC) using a HP series 1100 GPC system. Polystyrene standards were used for calibration, and tetrahydrofuran (THF) was used as the eluent at a flow rate of 1.0 mL/min.

All electrochemical measurements were made with an AUTOLAB PGSTAT 20 potentiostat (Eco Chemie) using a quasi-internal Ag wire reference electrode (BioAnalytical Systems) submersed in 0.01 M AgNO$_3$/0.1 M n-Bu$_4$NPF$_6$ in anhydrous MeCN. Typical CVs were recorded using platinum button electrodes or indium tin oxide (ITO) coated glass electrodes as the working electrode and a platinum coil counter electrode. The ferrocene/ferrocenium (Fc/Fc$^+$) redox couple was used as an external reference. Spectroelectrochemistry was performed under ambient laboratory conditions on polymer films cast onto ITO coated glass electrodes. The films were placed in a quartz cuvette in the path of the light source along with counter and reference electrodes as used above. In-situ conductivity measurements were carried out by using 5 μm interdigitated microelectrodes as working electrodes. Films were cast on interdigitated microelectrodes for conductivity studies by applying a cyclic potential. In situ conductivity measurements were carried out at a scan rate of 5 mV/s with a 40 mV offset potential between the two working electrodes. The conductivity (σ) was then calculated by the equation $\sigma=(i_D/V_D)(D/nTL)$, where $i_D$ is the drain current, $V_D$ is the offset potential, and T is the polymer thickness; with a 5 μm gap, D; n=99 gaps; and 0.5 cm electrode length, L. The conductivity was then calculated from the value of the drain current by applying geometrical factors and also corrected with a known material, poly(3-octylthiophene) (230 S/cm).

Figure 4:
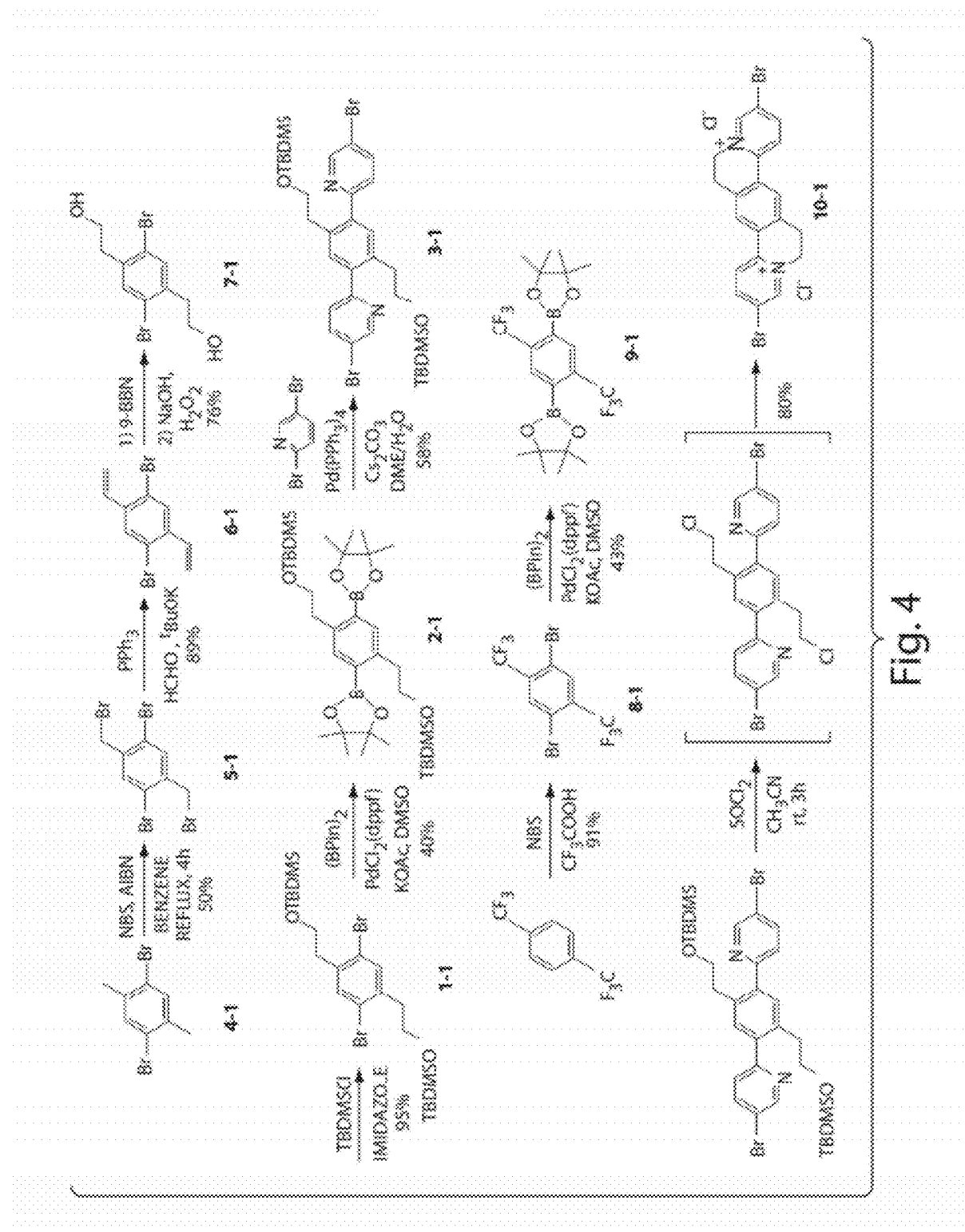
FIG. 4 shows the syntheses of compounds 3-1, 9-1, and 10-1.
Figure 5:
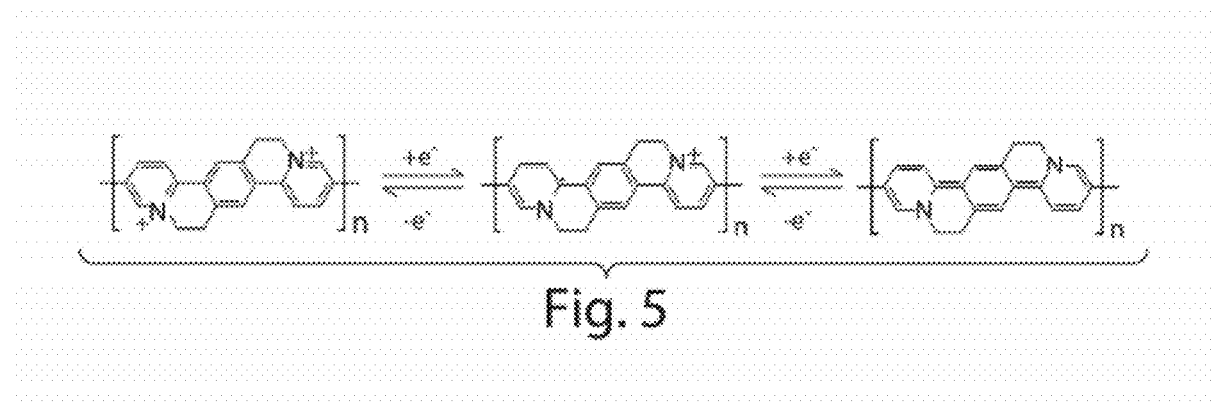
FIG. 5 shows the redox behaviors of P1-1.

FIG. 4 shows the syntheses of monomers 3-1, 9-1, and model compound 10-1. FIG. 5 shows the redox behaviors of P1-1. FIG. 6 shows Cyclic voltammogram (left) and in-situ conductivity measurement (right) of P1-1-P6-1 thin films.

Siloxyethyl-substituted poly(pyridine phenylene) P4-1: A solution of 3-1 (49 mg, 0.07 mmol), bis(1,5-cyclooctadiene) nickel (0) (23 mg, 0.084 mmol), 1,5-cyclooctadiene (10 μL, 0.084 mmol), and 2,2'-bipyridine (13 mg, 0.084 mmol) in 2 mL of anhydrous DMSO was stirred for 24 h at 60° C. under argon. The reaction mixture was cooled to room temperature, and precipitated into methanol. The precipitate was collected by centrifugation, dried, dissolved in chloroform, and then re-precipitated from methanol. The resulting pale yellow precipitate was collected by centrifugation and dried (65% yield). $^1$H NMR (300 MHz, CDCl$_3$): δ −0.04 (s, 12H), 0.83 (s, 18H), 3.10 (br, 4H), 3.81 (br, 4H), 7.47 (br, 2H), 7.66 (br, 2H), 8.07 (br, 2H), 9.03 (br, 2H).

Siloxyethyl-substituted poly(pyridine phenylene) copolymer P5-1: A solution of 3-1 (28 mg, 0.04 mmol), 9-1 (19 mg, 0.04 mmol), Pd(PPh$_3$)$_4$ (2.3 mg, 0.002 mmol), and Cs$_2$CO$_3$ (65 mg, 0.2 mmol) in 2/1 mL of DME and water was stirred for 24 h at 100° C. under argon. The reaction mixture was cooled to room temperature, and precipitated into methanol. The precipitate was collected by centrifugation, dried, dissolved in chloroform, and then re-precipitated from methanol. The resulting pale yellow precipitate was collected by centrifugation and dried (92% yield). $^1$H NMR (300 MHz, CDCl$_3$): δ −0.02 (s, 12H), 0.84 (s, 18H), 3.10 (br, 4H), 3.83 (br, 4H), 7.51 (s, 2H), 7.65 (br, 2H), 7.85 (br, 2H), 7.91 (s, 2H), 8.78 (s, 2H).

Siloxyethyl-substituted poly(pyridine phenylene) copolymer P6-1: A solution of 3-1 (28 mg, 0.04 mmol), 2,5-bis(trimethylstannyl) thiophene (16 mg, 0.04 mmol), and Pd(PPh$_3$)$_4$ (2.3 mg, 0.002 mmol) in 2 mL of DMSO was stirred for 24 h at 90° C. under argon. The reaction mixture was cooled to room temperature, and precipitated into methanol. The precipitate was collected by centrifugation, dried, dissolved in chloroform, and then re-precipitated from methanol. The resulting yellow precipitate was collected by centrifugation and dried (95% yield). $^1$H NMR (300 MHz, CDCl$_3$): δ −0.04 (s, 12H), 0.83 (s, 18H), 3.07(br, 4H), 3.79 (br, 4H), 7.43 (s, 2H), 7.49 (br, 2H), 7.54 (br, 2H), 8.03 (br, 2H), 9.04 (s, 2H).

Cyclization of 3-1 by the reaction with thionyl chloride: To a solution of 3-1 (20 mg, 0.028 mmol) in 3 mL of acetonitrile, SOCl$_2$ (0.6 mL) was added and the mixture was stirred at room temperature for 3 hours. The resulting solution was evaporated. Recrystallization from methanol and water gave model compound 10-1 as a pale yellow solid (80%). $^1$H NMR (300 MHz, D$_2$O): δ 3.41 (t, J=6.6 Hz, 4H), 4.85 (t, 4H), 8.18 (s, 2H), 8.45 (d, J=8.8 Hz, 2H), 8.74 (d, J=8.9 Hz, 2H), 9.14 (s, 2H). HR-MS (ESI): calcd for C$_{20}$H$_{16}$Br$_2$Cl$_2$N$_2$ 220.9835 [M-2Cl]$^{2+}$. found 220.9838.

Ethylene-bridged poly(pyridinium phenylene) P1-1: To a solution of P4-1 (24 mg, 0.044 mmol) in 5 mL of acetonitrile, SOCl$_2$ (1.0 mL) was added and the mixture was stirred at room temperature for 24 hours. The solution was evaporated, and then the resulting solid was washed with methanol and DMF to give polymer P1-1 as a yellow solid (98%). $^1$H NMR (300 MHz, D$_2$O): δ 3.57 (br, 4H), 5.04 (br, 4H), 8.37 (br, 2H), 8.84 (br, 2H), 9.06 (br, 2H), 9.50 (br, 2H).

Phenylene-linked poly(pyridinium phenylene) copolymer P2-1: A similar procedure was used as described for P1-1. P2-1 was isolated as a yellow solid (85%). $^1$H NMR (300

MHz, CD$_3$OD): δ 3.56 (br, 4H), 4.99 (br, 4H), 8.29 (br, 2H), 8.46 (br, 2H), 8.74 (br, 2H), 8.87 (br, 2H), 9.29 (br, 2H).

Thiophene-linked poly(pyridinium phenylene) copolymer P3-1 was prepared using a method similar as described for P1-1. P3-1 was isolated as a red solid (99%). $^1$H NMR (300 MHz, CD$_3$OD/D$_2$O): δ 3.42 (br, 4H), 7.86 (br, 2H), 8.19 (br, 2H), 8.52 (br, 2H), 8.78 (br, 2H), 9.26 (br, 2H).

Fabrication and characterization of polymer solar cells: The bilayer heterojunction solar cells were fabricated with a structure of ITO/PEDOT:PSS/P3HT(50 nm)/P1-1(50 nm)/Al. The ITO glass was pre-cleaned and modified by a thin layer of PEDOT:PSS (Bayer) which was spin-coated from a PEDOT:PSS aqueous solution on the ITO substrate. P3HT thin films were spin coated from a chloroform solution. On top of the resulting P3HT thin film a layer of P1-1 was spin coated from 2,2,2-trifluoroethanol solution, followed by drying at 80° C. for 30 min. Then the metal cathode Al (65 nm) was deposited on the polymer layer by vacuum evaporation. The effective area of one cell was 1 mm$^2$. Under the illumination of an AM 1.5 solar simulator (100 mW/cm$^2$), the bilayer heterojunction device exhibits an open circuit voltage (Voc) of 1.2 V, a short-circuit current density (Jsc) of 7 uA/cm$^2$, and a fill factor (FF) of 0.32. The power conversion efficiency (PCE) is 0.003%

Figure 7:
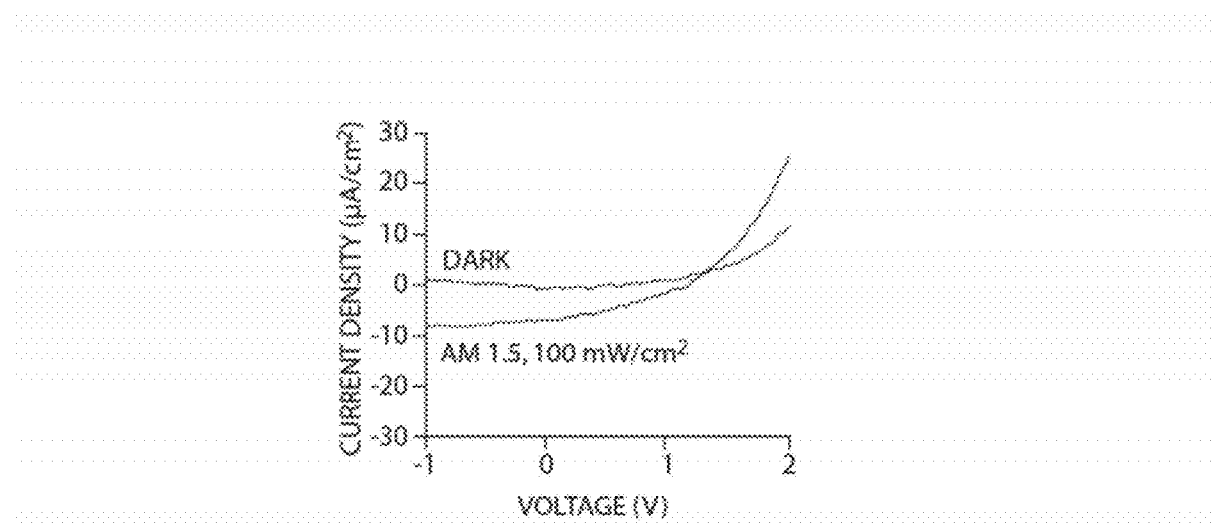
FIG. 7 shows current-voltage characteristics of a device with the structure ITO/PEDOT:PSS/P3HT(50 nm)/P1-1(50 nm)/Al in the dark and under illumination.

FIG. 7 shows current-voltage characteristics of a device with the structure ITO/PEDOT:PSS/P3HT(50 nm)/P1-1(50 nm)/Al in the dark and under the illumination of an AM 1.5 solar simulator, 100 mW/cm$^2$.

Fabrication and characterization of field effect transistors: Field effect transistors were fabricated in the bottom gate, bottom contact configuration on heavily n-doped silicon substrates as the gate and a thermally grown 230 nm SiO$_2$ as the dielectric insulator (Fraunhofer). The source and drain electrodes were patterned on the SiO$_2$ by lift-off technique of 10 nm of ITO and 30 nm of gold. The channel lengths (L) were 2.5, 5, 10, and 20 um, and the channel width (W) was 10 mm. Prior to polymer deposition, the surface of the devices were treated with UV/ozone irradiation for 10 min and subsequently 1,1,1,3,3,3-hexamethyldisilazane (HMDS) vapor. The devices were then cleaned with acetone and isopropanol. The polymer films were deposited by spin-coating 6 mg/mL 2,2,2-trifluoroethanol solution of P1-1. The mobility (u) was extracted from the saturation regime at $V_{DS}$=20 V using the slope of the line drawn through the linear part of an $I_{DS}^{1/2}$ vs. $V_G$ plot, where $V_G$, $V_{DS}$ and $I_{DS}$ are the gate voltage, drain-source voltage and current, respectively, from the equation $I_{DS}$=(W/2L)uCi($V_G$-$V_T$)$^2$. Electron field-effect mobility of 3.4 cm$^2$/Vs was extracted in the saturation region ($V_G$=15-20 V), with a low threshold voltage of ca. 8.4 V and a current on/off ratio 20.

Figure 8:
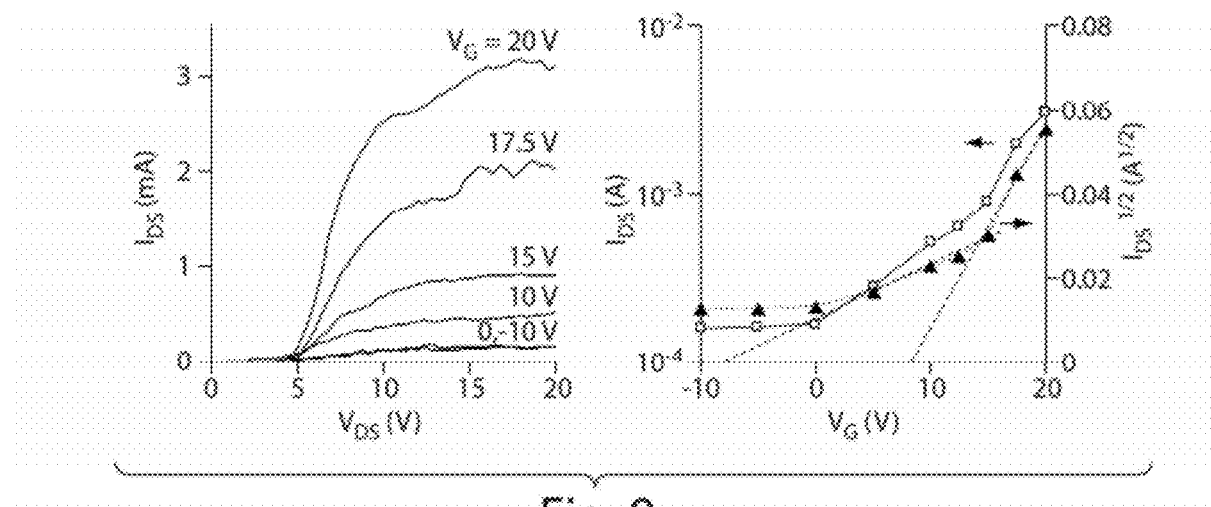
FIG. 8 shows the current-voltage characteristics at several values of the gate voltage ($V_G$) (left) and $(I_{DS})^{1/2}$ vs. $V_G$ plots at $V_{DS}$ of 20 V (right) for a bottom contact device with W=10 mm, L=10 um, and 100 nm of P1-1.

FIG. 8 shows the current-voltage characteristics ($I_{DS}$ vs. $V_{DS}$) at several values of the gate voltage ($V_G$) (left) and ($I_{DS}$)$^{1/2}$ vs. $V_G$ plots at $V_{DS}$ of 20V (right) for a bottom contact device with W=10 mm, L=10 um, and 100 nm of P1-1.

EXAMPLE 2

This example describes the synthesis and characterization of conjugated donor-acceptor semiconductive copolymers (P2-2 to P5-2) with pyridinium-phenylene units as the electron acceptor comonomer. The intramolecular charge transfer (ICT) interactions were modulated by choice of electron donor (D) units with the pyridinium-phenylene electron acceptor (A) units. The donor-acceptor copolymers (P3-2 to P5-2) exhibiting strong ICT have very small optical band gaps (0.8-1.4 eV), broad absorption bands that extend into the near-IR region, and ambipolar redox properties with large electron affinities (3.9-4.0 eV).

Experimental

See Example 1 for details regarding characterization of the polymer and materials. Materials were synthesized using known methods or according to Example 1, or were purchased from commercial sources. See also FIGS. 9 and 10.

Siloxyethyl-substituted poly(pyridine phenylene thiophene) copolymer P7-2. A solution of 3-2 (71 mg, 0.1 mmol), 4-2 (66 mg, 0.1 mmol), and Pd(PPh$_3$)$_4$ (5.8 mg, 0.005 mmol) in 5 mL of THF was stirred for 24 h at 75° C. under argon. The reaction mixture was cooled to room temperature, and precipitated into methanol. The precipitate was collected by centrifugation, dried, dissolved in chloroform, and then reprecipitated from methanol. The resulting yellow precipitate was collected by centrifugation and dried (92% yield).

Siloxyethyl-substituted poly(pyridine phenylene thiophene) copolymer P8-2, siloxyethyl-substituted poly(pyridine phenylene thiophene) copolymer P9-2, and siloxyethyl-substituted poly(pyridine phenylene thiophene) copolymer P10-2 were synthesized using similar methods as described for copolymer P7-2 to yield an orange precipitates in 90%, 91%, and 55% yield, respectively.

Ethylene-bridged poly(pyridinium phenylene thiophene) copolymer P2-2. To a solution of P6-2 (50 mg, 0.057 mmol) in 10 mL of CHCl$_3$, SOCl$_2$ (2.0 mL) was added and the mixture was stirred at room temperature for 24 hours. The solution was evaporated, and then the resulting solid was dissolved in methanol, and then re-precipitated and washed with hexane/ethanol to give polymer P2-2 as a red solid (95% yield). $^1$H NMR (300 MHz, CD$_3$OD): δ 0.89 (br, 6H), 1.32 (br, 12H), 1.72 (br, 4H), 2.72 (br, 4H), 3.58 (br, 4H), 5.01 (br, 4H), 7.98 (br, 2H), 8.43 (br, 2H), 8.79 (br, 2H), 8.89 (br, 2H), 9.49 (br, 2H).

Figure 9:
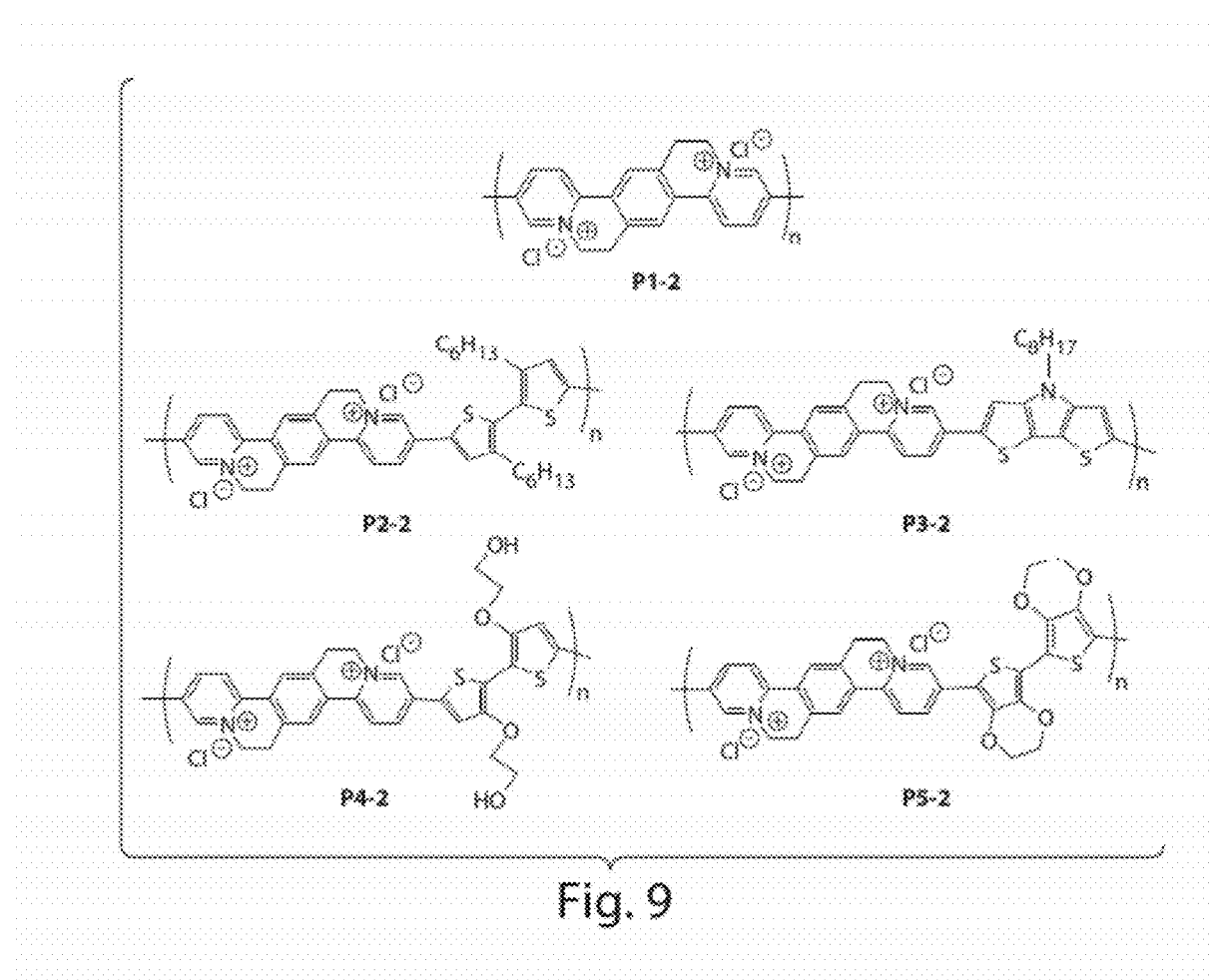
FIG. 9 shows structures of polymers P1-2 to P5-2, according to some embodiments.
Figure 10:
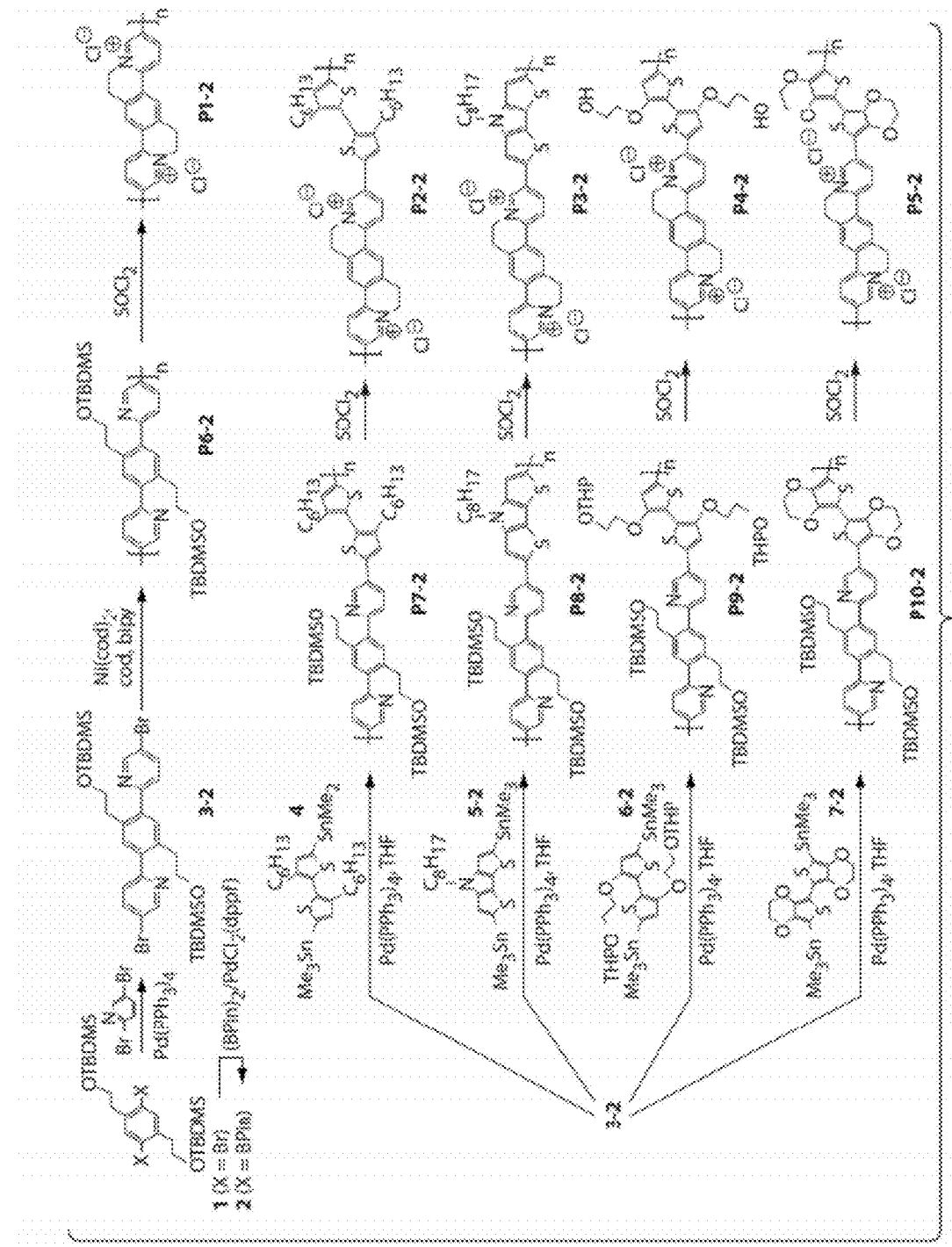
FIG. 10 shows the synthetic routes to P1-2 to P5-2, according to some embodiments.

Ethylene-bridged poly(pyridinium phenylene thiophene) copolymer P3-2, ethylene-bridged poly(pyridinium phenylene thiophene) copolymer P4-2, and ethylene-bridged poly(pyridinium phenylene thiophene) copolymer P5-2 were synthesized using procedures similarly described for copolymer P2-2 to yield violet blue precipitates in 90%, 91%, and 88% yield, respectively Results and Discussion Synthesis and characterization. FIG. 10 shows the synthetic routes to the homopolymer P1-2 and the alternating copolymers P2-2 to P5-2 (FIG. 9). Although the polyelectrolytes P1-2 and P2-2 were soluble in highly polar solvents such as water and methanol, the copolymers P3-5 containing stronger donor groups were soluble in aprotic polar solvents, such as DMF and DMSO, and were partially soluble in methanol. The weight average molecular weights (Mw) of P6-2 to P10-2 are given in Table 1-2. The molecular structures of the copolymers were verified by $^1$H NMR spectra. The $^1$H NMR spectra of the precursor copolymers P7-2 to P10-2 and cyclized polyelectrolytes P2-2 to P5-2 were in agreement with their structures Optical properties. To improve the efficiency of photovoltaic cells, the absorption spectra of the photovoltaic materials should match the solar spectrum that extends from 350 to 1500 nm with a maximum photon flux at around 700 nm. Therefore, conjugated polymers with broad absorption bandwidths and low band gaps are desirable for photovoltaic cells.

The optical absorption and emission spectra of the precursor homopolymer P6-2 and the bithiophene-based precursor copolymers P7-2 to P10-2 in dilute chloroform solution were obtained. As compared to homopolymer P6-2, 3,3'-dihexyl-2,2'-bithiophene-based copolymer P7-2 displayed 30 nm red shift as a result of the donor-accepter type structure as well as less steric hindrance. Furthermore, the solution absorption spectra of N-(1-octylnonyl)dithieno[3,2-b:2',3'-d]pyrrole-based copolymer P8-2, with an absorption maximum ($\lambda_{max}$) at 423 nm, 3,3'-bis(2-hydroxyethoxy)-2,2'-bithiophene-based copolymer P9-2 ($\lambda_{max}$=435 nm), and 2,2'-bis(3,4-ethylenedioxythiophene)-based copolymer P10-2 ($\lambda_{max}$=428, 448 nm), were broadened and red-shifted compared to that of P7-2 ($\lambda_{max}$=352 nm). In the chain structures of P8-2 to P10-2, the N-alkyldithienopyrrole, bis(alkyloxy)-bithiophene, or bis(alkylenedioxythiophene) moieties are much more electron-rich units compared to dialkylbithiophene of P7-2, resulting in the much stronger ICT effects.

The optical properties of the homopolymer P1-2 and the donor-acceptor alternating copolymers P2-2 to P5-2 are summarized in Table 1. The absorption spectra of P1-2 to P5-2 were red-shifted relative to their respective precursors. This may be attributed to the two ethylene bridges enforcing a planar conformation of the pyridinium-phenylene segment and inserting the electronic accepting pyridiniums. The thin film absorption spectra were generally similar in shape to those in dilute solutions. The solutions of P3-2 to P5-2 with the stronger donor units had broad absorption bands that extended into the near-infrared region with a $\lambda_{max}$ at 632 nm for P3-2, 700 nm for P4-2, and 600 nm for P5-2. Their optical band gap ($E_g^{opt}$) derived from the absorption edge of the thin film spectra was in the range 1.1-1.6 eV (Table 1-2). Insertion of pyridinium-phenylene segment into the repeating structure of poly(5-2), poly(6-2), or poly(7-2) had an effect on their $E_g^{opt}$ (1.55-1.80 eV), and among them P5-2 with the most electron-rich bis(3,4-ethylenedioxythiophene) units has the strongest ICT interaction, and the smallest optical band gap, 1.1 eV, which is much smaller than that of homopolymer P1-2 (2.6 eV). P2-2 had weak emission bands with peaks at 442 nm in dilute DMF solution, but all of the P3-5 have essentially no detectable emission in solutions and thin films.

Electrochemical properties. The oxidation and reduction potentials of thin films of pyridinium-based conjugated D-A copolymers P2-2 to P5-2 and their respective precursors P6-2 to P10-2 were determined by cyclic voltammetry in $CH_2Cl_2$ or $CH_3CN$ (vs SCE) (Table 1-2; see FIG. 11). FIG. 11 shows cyclic voltammograms of drop-cast films of P2-1 to P5-2 and P6-2 to P10-2 on a Pt button electrode in $CH_2Cl_2$ or $CH_3CN$ with 0.1 M $TBAPF_6$ as a supporting electrolyte. The reduction potentials of P2-2 to P5-2 were more positive relative to P6-2 to P10-2 with the introduction of the highly electron-withdrawing pyridinium rings. Copolymers P2-2 to P5-2 showed two reversible viologen-like redox behavior, and among them P3-2 to P5-2 displayed reversible ambipolar redox properties as evident from areas and close proximity of the anodic and cathodic peaks. The oxidation wave was observed in the cyclic voltammogram of P3-2 to P5-2 at the formal potentials between 0.72 and 1.33 V, whereas no oxidation wave was observed for P2-2 with weaker electron-donating groups. Also P2-2 to P5-2 exhibited two similar potential reductions ranging from −0.99 to −0.71 V. The onset reduction and oxidation potentials of the polyelectrolytes P2-2 to P5-2 were from −0.55 to −0.42 V and from 0.27 to 0.98 V (vs. SCE), respectively, from which an electron affinity was estimated to be (EA, LUMO level) 3.9 to 4.0 eV (EAE=$E_{red}^{onset}$+4.4) and an ionization potentials (IP, HOMO level) of 4.7 to 5.9 eV (IP=$E_{ox}^{onset}$+4.4). The EA values were higher than those estimated in the same method for most conventional polyheterocycles, and are comparable to well known electron transporters PCBM (4.2 eV) or BBL (4.0 eV), as well as homopolymer P1-2 (4.0 eV). The lower band gap values of P3-2 to P5-2 compared to those of the homopolymers P1-2 may be due to the strong ICT exhibited by these D-A alternating copolymers.

An electrochemically reversible charge trapping behavior was observed in the CVs of P4-2 and P5-2. Scanning the reductive and oxidative regions separately also results in reversible redox behavior. In the case of P4-2, the cyclic voltammogram showed six peaks in the potential range between −1.5 and 1.1 V (vs. SCE). The position of peak A corresponded to the reported oxidation potential of bis(alkyloxy)-bithiophene moiety, and the positions of the C-F and D-E couples are appropriate to the doping and undoping potentials of poly(pyridinium phenylene) P1-2. In the range from −0.5 to 1.1 V, only the A-B couple was observed, whereas scanning in the range −1.5 to 0 V gives rise only to the C-F and D-E couples. These observations indicate that the A-B couple was mainly related to the oxidation and re-reduction of the bithiophene units, whereas the C-F and D-E couples were related to the reduction and oxidation of the pyridinium-phenylene units. The unusually large potential

TABLE 1-2

Optical and electrochemical properties of P1-2 to P5-2

| polymer | Mn | Mw/Mn | $\lambda_{max}$ (nm) | $\lambda_{onset}$ (nm) | $E_g^{opt\,a}$ (eV) | $E_{red}^{b}$ (V) | $E_{red}^{onset\,b}$ (V) | $E_{ox}^{b}$ (V) | $E_{ox}^{onset\,b}$ (V) | $E_g^{el\,c}$ (eV) | $EA^d$ (eV) | $IP^e$ (eV) |
|---|---|---|---|---|---|---|---|---|---|---|---|---|
| P1-2 | 15600 | 1.5 | 431 | 485 | 2.6 | −0.56, −1.27 | −0.40 | — | — | — | 4.0 | 6.6 |
| P2-2 | 26700 | 1.9 | 462 | 620 | 2.0 | −0.71, −0.90 | −0.55 | — | — | — | 3.9 | 5.9 |
| P3-2 | 26900 | 2.2 | 615 | 787 | 1.6 | −0.90, −1.25 | −0.42 | 1.33 | 0.98 | 1.4 | 4.0 | 5.4 |
| P4-2 | 12700 | 1.7 | 730 | 990 | 1.3 | −0.92, −1.25 | −0.42 | 1.14 | 0.77 | 1.2 | 4.0 | 5.2 |
| P5-2 | 7000 | 1.4 | 608 | 1100 | 1.1 | −0.99, −1.27 | −0.51 | 0.72, 1.13 | 0.27 | 0.8 | 3.9 | 4.7 |

$^a E_g^{opt}$: Optical band gap estimated from the band edge ($\lambda_{onset}$) of the absorption spectra.
$^b E_{red}, E_{red}^{onset}, E_{ox}, E_{ox}^{onset}$: Formal and onset reduction and formal and onset oxidation potentials (vs SCE).
$^c E_g^{el}$: Electrochemical band gap estimated from the onset reduction and oxidation potentials.
$^d$ EA: Electron affinity obtained based on EA = $E_{red}^{onset}$ + 4.4 (eV).
$^e$ IP: Ionization potential calculated from IP = EA + $E_g^{opt}$ for P1-2 to P2-2 and IP = $E_{ox}^{onset}$ + 4.4 (eV) for P3-2 to P5-2 (eV).

difference between the A and B peaks suggests the occurrence of a particular chemical interaction (possibly a weak σ-bond or π-bond) after the oxidation of the thiophene ring. The electrochemical band gap ($E_g^{el}$=IP−EA) was determined from to be 1.4 eV for P3-2, 1.2 eV for P4-2, and 0.8 eV for P5-2, which are 0.1-0.3 eV larger than the optically determined ones ($E_g^{opt}$=1.1-1.6 eV).

In-situ conductivity measurement. In-situ conductivity measurements of P3-2 to P5-2 thin films were made using interdigitated microelectrodes and reveal a narrow window of high conductivity[21]. Their in-situ conductance measurements were consistent with doping processes observed by cyclic voltammetry. The maximum in situ conductivities of P3-2 ($\sigma_{max}$=183 S/cm), P4-2 ($\sigma_{max}$=130 S/cm), and P5-2 ($\sigma_{max}$=60 S/cm) rival values observed of well-known p-type poly(3- alkylthiophene)s. Although the cyclic voltammetry results showed oxidative and reductive redox properties, measurable p-type conductivities were not observed in any of the copolymer semiconductors. The narrow window of the in situ conductivity profile indicates that the 'mixed valence' state was conductive and that the neutral (fully reduced) material was insulating, as similar to homopolymer P1-2.

EXAMPLE 3

In this example, the synthesis and characterization of conjugated donor-acceptor-donor type block copolymer semiconductors, regioregular poly(3-hexylthiophene)-block-poly(pyridinium pheneylene) (P3HT-b-PPymPh) are reported. The regioregular poly(3-hexylthiophene) (P3HT) segments served as the electron donors (D) and poly(pyridinium phenylene) segments are used as the electron acceptors (A). The block copolymers were synthesized from a P3HT macroinitiator that was extended by a Yamamoto copolymerization to create a siloxyethyl-substituted poly(pyridine phenylene) block that was then converted by intramolecular cyclization into a polyelectrolyte block copolymer, poly(3-hexylthiophene)-block-poly(pyridinium phenylene).

Experimental Section

See Example 1 for details regarding characterization of the polymer and materials. Materials were synthesized using known methods or according to Example 1, or were purchased from commercial sources. See also FIG. 12.

Regioregular Br-P3HT: Monobromo-terminated, regioregular head-to-tail poly(3-hexylthiophene) (Br-P3HT) was synthesized according to literature procedures.

Representative Synthesis of Precursor Block Copolymer P3HT-b-PPyPh: A solution of 3 (71 mg, 0.10 mmol), Br-P3HT (50 mg, 0.3 mmol based upon the repeating unit), bis(1,5-cyclooctadiene)nickel(0) (88 mg, 0.32 mmol), 1,5-cyclooctadiene (40 uL, 0.32 mmol), and 2,2'-bipyridine (50 mg, 0.32 mmol) in 6 mL of anhydrous THF was stirred for 48 h at 75° C. under argon. The reaction mixture was cooled to room temperature and precipitated into methanol. The precipitate was collected by centrifugation, dried, dissolved in chloroform, and then re-precipitated from methanol. The resulting purple precipitate was collected by centrifugation and dried (96% yield). $^1$H NMR (300 MHz, CDCl$_3$): δ –0.04, 0.83, 1.35, 1.70, 2.80, 3.09, 3.79, 6.98, 7.47, 7.66, 8.06, 9.03 GPC: Mn=26200, Mw/Mn=1.55.

Representative Synthesis of Block Copolymer P3HT-b-PPymPh: To a solution of precursor P3HT-b-PPyPh (30 mg) in 10 mL of CHCl$_3$, n-C$_4$F$_9$SO$_2$F (2.0 mL) and a 1 M solution of [n-Bu$_4$N]F (2.0 mL) in THF were added and the mixture was stirred at 67° C. for 24 hours. The reaction mixture was cooled to room temperature and precipitated into hexane. The precipitate was collected by centrifugation, dried, dissolved in DMF, and then reprecipitated from hexane. The resulting orange precipitate was collected by centrifugation and dried (90% yield).

Results and Discussion

Figure 12:
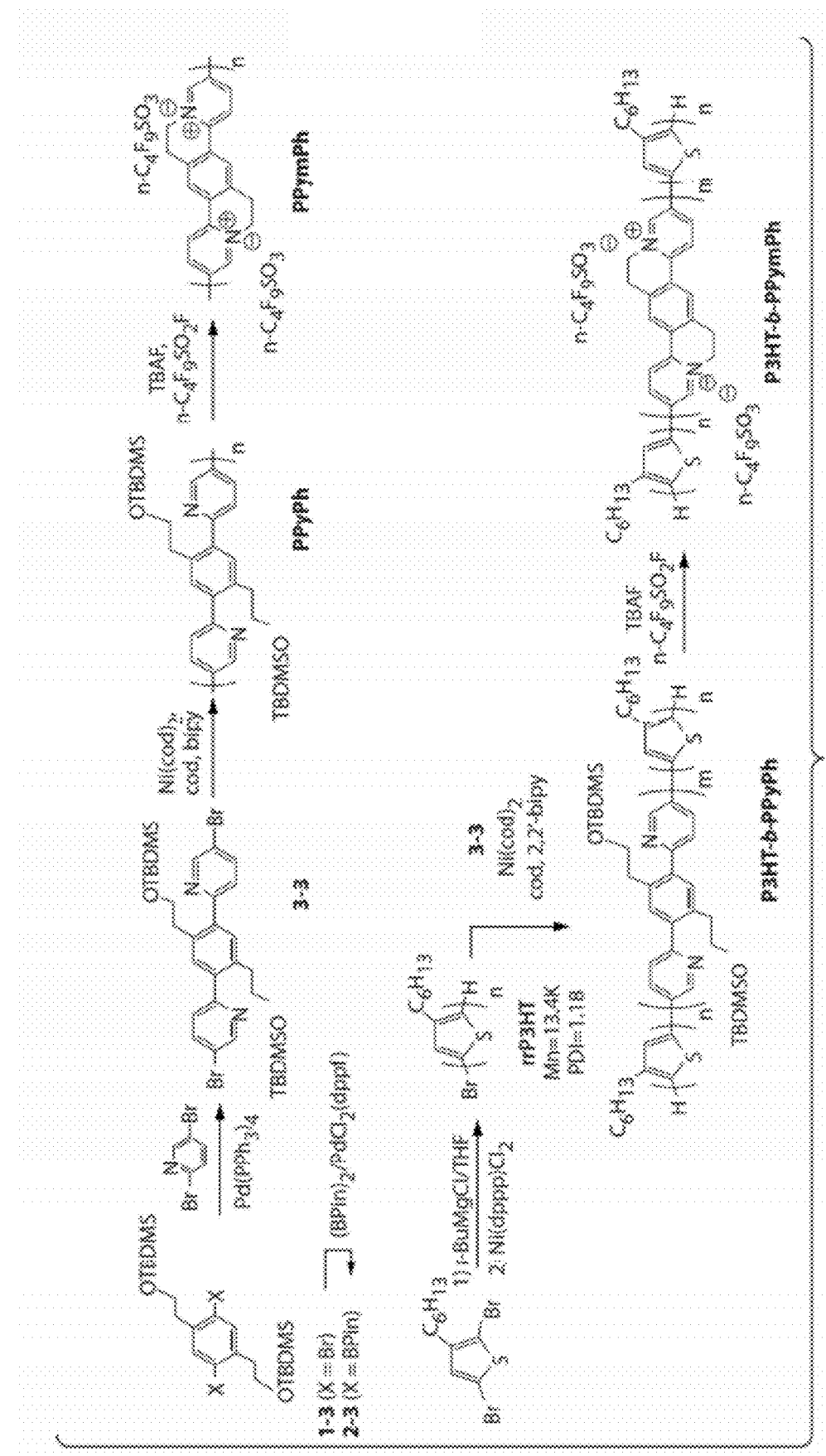
FIG. 12 shows the synthetic routes to polymers PPymPh and P3HT-b-PPymPh, according to some embodiments.

Synthesis and Characterization. FIG. 12 shows the synthetic routes to the homopolymer PPymPh and the block copolymer P3HT-b-PPymPh. The synthetic approach to the conjugated donor-acceptor-type block copolymers P3HT-b-PPymPh involved three steps: First, monobromo-terminated poly(3-hexylthiophene) (Br-P3HT) macromonomer building blocks were synthesized according to known procedures.

Second, a pyridyl precursor triblock copolymer P3HT-b-PPyPh, was synthesized and subsequently subjected to intramolecular nucleophilic substitution reactions to produce cyclic pyridiniums. The triblock precursor copolymers P3HT-b-PPyPh were synthesized under Yamamoto conditions with the dibromo building blocks 3-3 as central acceptor segments and the monobromo Br-P3HTs as donor segments. High-molecular-weight siloxyethyl-substituted block copolymers P3HT-PPyPh with different compositions were obtained that were soluble in common organic solvents (e.g. CHCl$_3$, THF). The block copolymers were characterized and the results are summarized in Table 1-3. The chromatograms shifted to a higher molecular weight region from the first stage to the second one. The molecular weight distributions were dominantly monomodal for the block copolymers indicating that the Br-P3HT macromonomers have undergone reaction.

In the third step, quaternizative cyclization induced by tetra-n-butylammonium fluoride and nonafluorobutanesulfonyl fluoride gave block copolymers P3HT-b-PPymPh. P3HT blocks are easily doped by thionyl chloride, and as a result new cyclization reaction conditions for block copolymers that do not result in doping of P3HT segments were developed. Additionally, these efforts are complicated by the fact that P3HT is soluble in nonpolar solvents (CHCl$_3$, THF, etc), whereas the polyelectrolyte PPymPh and the copolymers P3HT-b-PPymPh are soluble in aprotic polar solvents, such as DMF and DMSO.

TABLE 1-3

Molar ratios of repeating units, molecular weights, and polydispersity indices of P3HT-b-PPyPh.

| Polymer | Molar ratio of repeat unit in the feed (P3HT/PPyPh) | Molar ratio of repeat unit as determined $^1$H NMR (P3HT/PPyPh) | Mn | Mw/Mn |
|---|---|---|---|---|
| P3HT | 100/0 | 100/0 | 13400 | 1.18 |
| P3HT90-b-PPyPh10 | 86/14 | 90/10 | 29700 | 2.11 |
| P3HT80-b-PPyPh20 | 75/25 | 80/20 | 26200 | 1.55 |
| PPyPh | 0/100 | 0/100 | 17000 | 1.44 |

Optical Properties. The optical absorption spectra of the precursor block copolymers P3HT-b-PPyPh, and the corresponding homopolymers P3HT and PPyPh in dilute chloroform solution were obtained. The absorption spectra of precursor block copolymers are a superposition of those of the two polymer components, P3HT (an absorption maximum, $\lambda_{max}$=452 nm) and PPyPh ($\lambda_{max}$=319 nm), indicating no detectable ground state interaction between P3HT and PPyPh segments. The absorption spectra of acceptor segments in block copolymers are significantly red-shifted relative to their respective precursors. This may be in part a result of the ethylene bridges enforcing a planar conformation of the pyridinium-phenylene segment. Additionally, the solution absorption spectra of block copolymers were generally similar in shape to those of homopolymers PPymPh and P3HT. The weak absorption maximum of the P3HT donor block at 452 nm was overlapped by the stronger absorbing PPymPh ($\lambda_{max}$=403 nm), and was visible as a red-shift shoulder in the solution spectra. The absorption spectra of thin films were significantly red-shifted relative to the solution absorption spectra. The absorption at $\lambda_{max}$=520 nm resulted from a crystallization of the P3HT chains into a coplanar intrachain conformation. A longer wavelength shoulder of the donor segments at 550-700 nm and the red-shifted absorption maximum of acceptor segments around 420 nm were observed in the case of block copolymers, and may be suggestive of intermolecular charge transfer interaction between donor and acceptor blocks.

TABLE 2-3

Optical and Electrochemical Properties of P3HT, P3HT-b-PPymPh, and PPymPh.

| polymer | $\lambda_{max}$ (nm) | $\lambda_{onset}$ (nm) | $E_g^{opta}$ (eV) | $E_{red}^{b}$ (V) | $E_{red}^{onsetb}$ (V) | $E_{ox}^{b}$ (V) | $E_{ox}^{onsetb}$ (V) | $E_g^{elc}$ (eV) | $EA^d$ (eV) | $IP^e$ (eV) |
|---|---|---|---|---|---|---|---|---|---|---|
| P3HT | 516 | 653 | 1.9 | — | — | 1.24 | 0.73 | — | 3.2 | 5.1 |
| P3HT90-b-PPymPh10 | 416, 530 | 672 | 1.8 | −0.94 | −0.61 | 1.15 | 0.71 | 1.3 | 3.8 | 5.1 |
| P3HT80-b-PPymPh20 | 421, 546 | 704 | 1.8 | −0.81, −1.56 | −0.44 | 1.04 | 0.71 | 1.2 | 4.0 | 5.1 |
| PPymPh | 407 | 470 | 2.6 | −0.83, −1.51 | −0.45 | — | — | — | 4.0 | 6.6 |

$^a E_g^{opt}$: Optical band gap estimated from the band edge ($\lambda_{onset}$) of the absorption spectra.
$^b E_{red}, E_{red}^{onset}, E_{ox}, E_{ox}^{onset}$: Formal and onset reduction and formal and onset oxidation potentials (vs. SCE).
$^c E_g^{el}$: Electrochemical band gap estimated from the onset reduction and oxidation potentials.
$^d$EA: Electron affinity obtained based on EA = $E_{red}^{onset}$ + 4.4 (eV) for P3HT-b-PPymPh, PPymPh and EA = IP − $E_g^{opt}$ for P3HT.
$^e$IP: Ionization potential calculated from IP = EA + $E_g^{opt}$ (eV) for PPymPh and IP = $E_{ox}^{onset}$ + 4.4 (eV) for P3HT, P3HT-b-PPymPh (eV).

Electrochemical Properties. The oxidation and reduction potentials of thin films of pyridinium-based conjugated D-A block copolymers P3HT-b-PPymPh and their respective precursors P3HT-b-PPyPh were determined by cyclic voltammetry in CH$_3$CN (vs. SCE), as shown in FIG. 13 and summarized in Table 2-3. FIG. 13a-d presents the cyclic voltammograms of P3HT, P3HT90-b-PPymPh10, P3HT80-b-PPymPh20, and PPymPh, respectively. The reduction potentials of P3HT-b-PPymPh and PPymPh were significantly more positive relative to their respective precursors. This may be attributed to the highly electrophilic pyridinium rings. All of the pyridinium-containing polymers P3HT-b-PPymPh and PPymPh showed reversible viologen-like redox behavior, and the donor-acceptor block copolymers P3HT-b-PPymPh displayed reversible ambipolar redox properties as evident from the areas and close proximity of the anodic and cathodic peaks. An oxidation wave was observed in the cyclic voltammogram of the P3HT-containing polymers, P3HT and P3HT-b-PPymPh, at the formal potentials between 1.04 and 1.24 V, while no oxidation wave was observed for PPymPh that lacked P3HT blocks. Also P3HT-b-PPymPh and PPymPh exhibited similar reduction behavior between −0.81 to −1.56 V. The onset reduction and oxidation potentials of the block copolymers P3HT-b-PPymPh were from −0.61 to −0.44 V and 0.71 V (vs. SCE), respectively, from which it can be estimated an electron affinity (EA, LUMO level) of 3.8 to 4.0 eV (EA=$E_{red}^{onset}$+4.4) and an ionization potential (IP, HOMO level) of 5.1 eV (IP=$E_{ox}^{onset}$+4.4). The EA values were higher than those estimated with the same method for most conventional polyheterocycles, and were comparable to well known electron transporters PCBM (4.2 eV) or BBL (4.0 eV), as well as homopolymer PPymPh (4.0 eV).

Figure 13A:
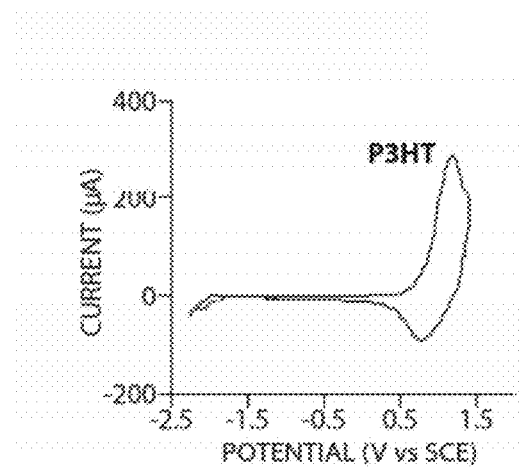
FIGS. 13a-e show the cyclic voltammograms of P3HT, P3HT90-b-PPymPh10, P3HT80-b-PPymPh20, and PPymPh.
Figure 13B:
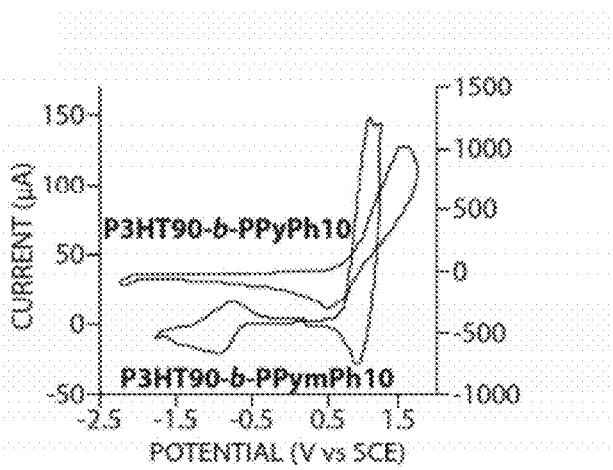
Figure 13C:
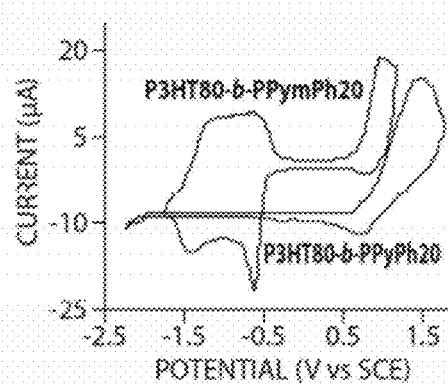
Figure 13D:
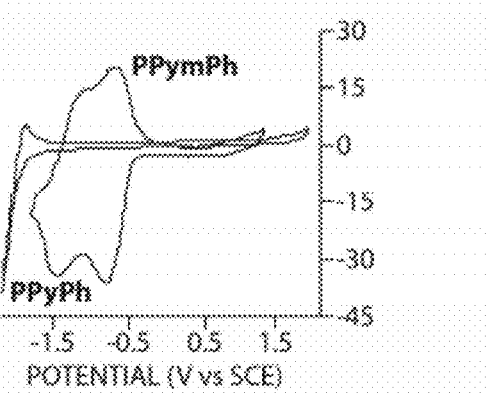
Figure 13E:
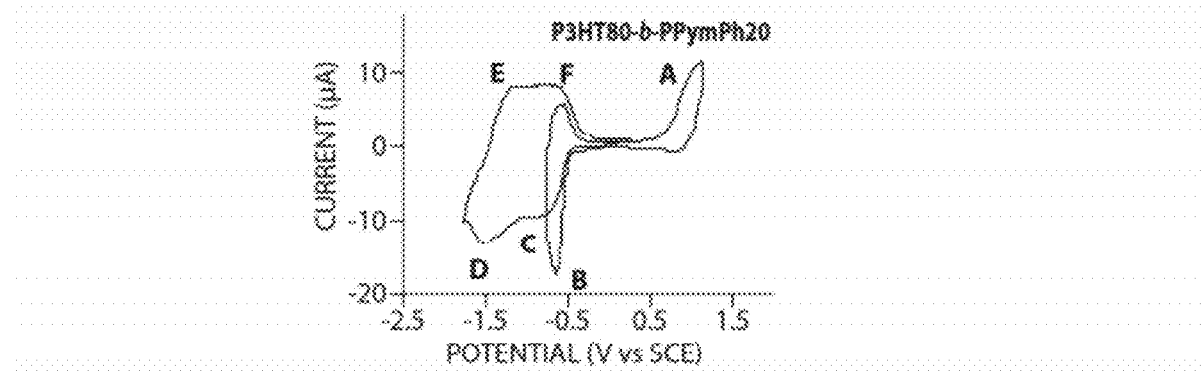

An electrochemically reversible charge trapping behavior was observed in the CVs of P3HT80-b-PPymPh20 with 20 mol % of acceptor moieties (FIGS. 13c and 13e). Scanning the reductive and oxidative regions separately resulted in reversible redox behavior, as shown in FIG. 13e. The cyclic voltammogram showed six peaks A-F in the potential range between −1.7 and 1.1 V (vs. SCE, FIGS. 13c and 13e). The position of peak A corresponds to the reported oxidation potential of P3HT donor moiety, and the positions of the C-F and D-E couples are in agreement with the doping and undoping potentials of poly(pyridinium phenylene) PPymPh. In the range from −0.8 to 1.1 V, mainly the A-B couple was observed, whereas scanning in the range −1.7 to 0.3 V gives rise only to the C-F and D-E couples (FIG. 13e). These observations indicate that the A-B couple may be primarily related to the oxidation and reduction of the P3HT donor blocks, whereas the C-F and D-E couples may be primarily related to the reduction and oxidation of the PPymPh acceptor blocks. The unusually large potential difference between the A and B peaks may suggest the occurrence of a particular chemical interaction after the oxidation of the thiophene ring that may prevent reduction at the thermodynamic potential. Specifically, FIG. 13 shows cyclic voltammograms of dropcast films of (a) P3HT, (b, c, e) P3HT-b-PPymPh, (d) PPymPh and the corresponding precursors on a Pt button electrode in CH$_3$CN with 0.1 M TBAPF$_6$ as a supporting electrolyte.

Morphology. The morphology of P3HT-b-PPymPh block copolymer thin films was investigated by using transmission electron microscopy (TEM). FIGS. 14a-b present TEM morphology images of dropcast thin films of P3HT-b-PPymPh with the block molar ratio of 90:10 and 80:20. Films of P3HT80-b-PPymPh20 block copolymer with the block ratio of 80:20 (FIG. 14b) formed nanosized spherical aggregates with a diameter of roughly 10-30 nm. In the case of P3HT90-b-PPymPh10 block copolymers with the block ratio of 90:10 (FIG. 14a) nanofiber-like structures of P3HT blocks with a similar diameter were observed. The latter nanoscopic morphology may present advantages for the design of efficient bulk heterojunction solar cell devices when considering the short exciton diffusion lengths of organic semiconductors. These results demonstrate that the covalent binding of P3HT donor and PPymPh acceptor segments can control the scale length of nanostructural formation and can allow for optimized bulk heterojunction photovoltaic cells, in some embodiments. FIG. 14 shows TEM images of the self-assembled structures of (a) P3HT90-b-PPymPh10 and (b) P3HT80-b-PPymPh20.

X-Ray Diffraction Measurement. X-ray diffraction (XRD) measurements were performed on thin films of P3HT-b-PPymPh with the block ratio of 90:10 and 80:20, and on P3HT and PPymPh homopolymers for reference to analyze the molecular packing and orientations of block copolymers (FIG. 15). The P3HT film showed characteristic diffraction peaks at 2θ of 5.22, 10.59 and 15.82° consistent with its lamellar structure and a lattice constant of 1.69 nm for the (h00) plane. The thin film of the PPymPh homopolymer showed a weaker diffraction peak at 7.95° that may correspond to weak ordering in a lamellar structure with an interlayer distance of ca 1.1 nm. This was smaller than that of the P3HT homopolymer, which is consistent with the shorter side chains of PPymPh. Thin films of P3HT-b-PPymPh with the block ratio of 90:10 and 80:10 showed XRD patterns with the same features as the P3HT and PPymPh homopolymers. This may indicate that P3HT or PPymPh blocks formed a layered crystalline structure with strong orientations similar to the corresponding homopolymers, which is also consistent with the TEM image analysis (FIG. 14). FIG. 15 shows XRD spectra for (a) P3HT, (b) P3HT90-b-PPymPh10, (c) P3HT80-b-PPymPh20, and (d) PPymPh.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:

1. A polymeric composition, comprising:

a polymer backbone comprising at least one repeating unit having the structure:

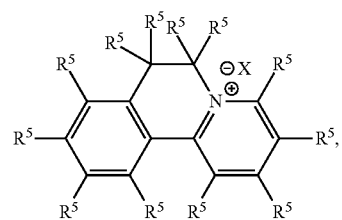

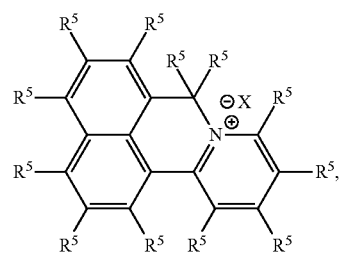

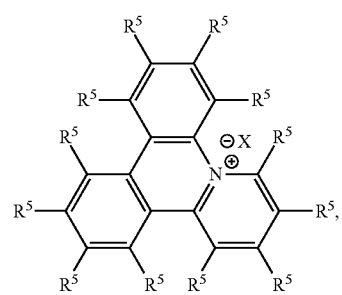

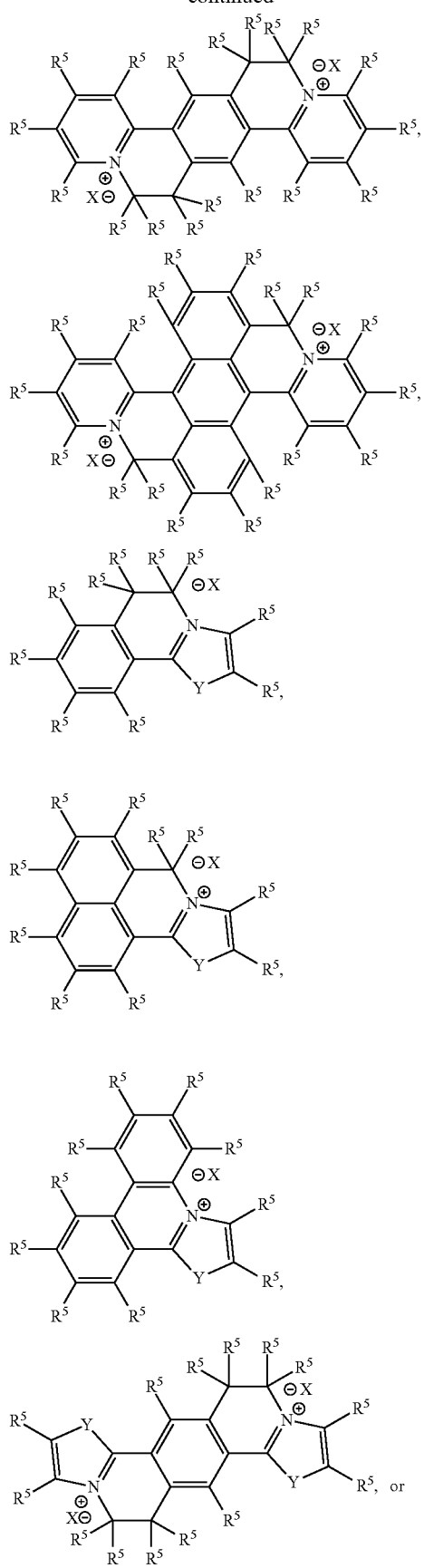

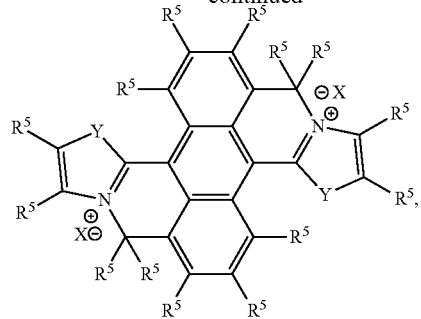

wherein $X^{\ominus}$ is an anionic species;

Y is a heteroatom; and wherein each $R^5$ can be the same or different and is a suitable substituent, may join together with another $R^5$ to form a ring, and/or may form a bond with another repeating unit and/or an end-group of the polymer, in accordance with standard valence requirements.

2. A polymeric composition, comprising:

a polymer backbone comprising at least one repeating unit comprising the structure:

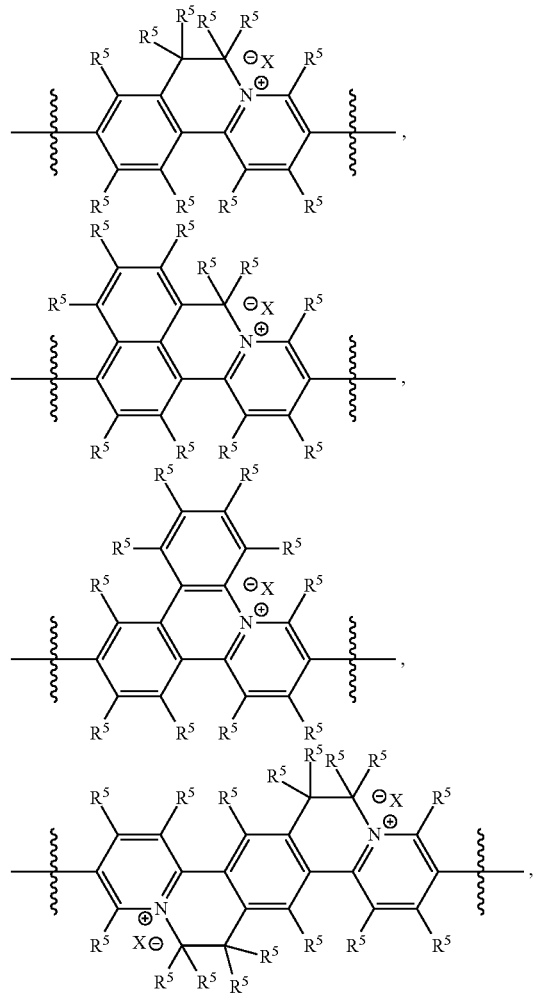

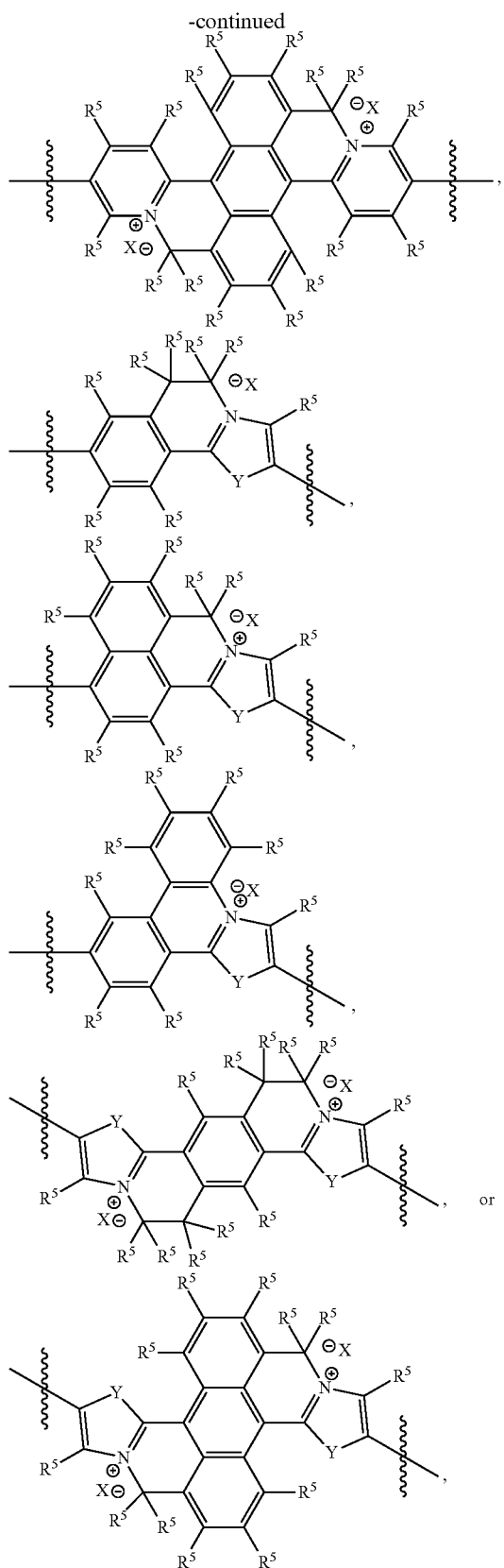

wherein ⦃ indicates the location of the bond to another repeating unit or an end-group;

wherein $X^\ominus$ is an anionic species;

Y is a heteroatom; and wherein each $R^5$ can be the same or different and is a suitable substituent, may join together with another $R^5$ to form a ring, and/or may form a bond with another repeating unit and/or an end-group of the polymer, in accordance with standard valence requirements.

3. A polymeric composition as in claim 1, wherein each $R^5$ is H, provided at least two $R^5$ are a bond to another repeating unit or an end-group.

4. A polymeric composition as in claim 1, wherein Y is S or O.

5. A polymeric composition as in claim 1, wherein the at least one repeating unit comprises the following structure:

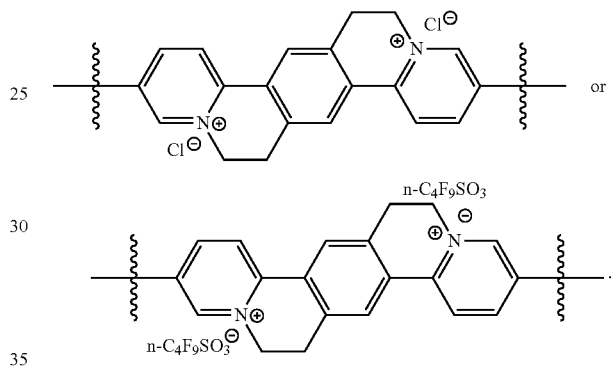

6. A polymeric composition as in claim 2, wherein each $R^5$ is H, provided at least two $R^5$ are a bond to another repeating unit or an end-group.

7. A polymeric composition as in claim 2, wherein Y is S or O.

8. A polymeric composition as in claim 2, wherein the at least one repeating unit comprises the following structure:

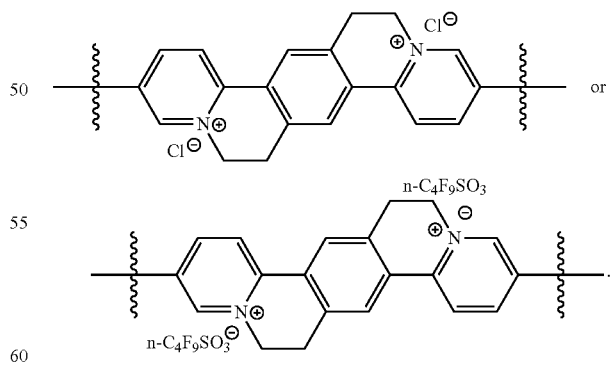

* * * * *